United States Patent
Komatsu et al.

(10) Patent No.: US 6,855,892 B2
(45) Date of Patent: Feb. 15, 2005

(54) INSULATION SHEET, MULTI-LAYER WIRING SUBSTRATE AND PRODUCTION PROCESSES THEREOF

(75) Inventors: Shingo Komatsu, Kadoma (JP); Seiichi Nakatani, Hirakata (JP); Yasuhiro Sugaya, Toyonaka (JP); Toshiyuki Asahi, Osaka (JP); Yoshiyuki Yamamoto, Neyagawa (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 11 days.

(21) Appl. No.: 10/246,476

(22) Filed: Sep. 19, 2002

(65) Prior Publication Data

US 2003/0085058 A1 May 8, 2003

(30) Foreign Application Priority Data

Sep. 27, 2001 (JP) .................................. 2001-296819

(51) Int. Cl.$^7$ ............................................. H01R 12/04
(52) U.S. Cl. ...................... 174/256; 174/258; 174/264; 428/321.3
(58) Field of Search ................ 174/256–258, 174/262, 264, 266; 428/209, 210, 304.4, 321.3, 901

(56) References Cited

U.S. PATENT DOCUMENTS

| 6,038,133 A | 3/2000 | Nakatani et al. |
| 6,138,350 A | 10/2000 | Bhatt et al. |
| 6,239,983 B1 | 5/2001 | Shingai et al. |
| 6,451,710 B1 * | 9/2002 | Oka et al. .................. 438/778 |
| 6,518,514 B2 * | 2/2003 | Suzuki et al. ............... 174/262 |
| 6,528,733 B2 * | 3/2003 | Takenaka et al. ........... 174/255 |
| 6,538,210 B2 * | 3/2003 | Sugaya et al. .............. 174/258 |
| 6,625,880 B2 * | 9/2003 | Nabemoto et al. ............. 29/830 |

FOREIGN PATENT DOCUMENTS

| JP | 11-220262 | 8/1999 |
| JP | 2001-155544 | 6/2001 |

* cited by examiner

*Primary Examiner*—Dean A. Reichard
*Assistant Examiner*—Adolfo Nino
(74) *Attorney, Agent, or Firm*—Wenderoth, Lind & Ponack, L.L.P.

(57) ABSTRACT

An insulation sheet for use in producing a wiring substrate comprises, as via bole conductors, conductive paste filled in via holes formed through the insulation sheet, and a curing-starting temperature of the conductive paste is lower than a melting-starting temperature of the insulation sheet. A wiring substrate is produced by laminating such insulation sheets, that have conductive paste in via holes, and subjecting this laminate to thermo-compression bonding, wherein deformation of via holes and dislocation of the via holes, because of a molten insulation sheet, does not occur.

44 Claims, 6 Drawing Sheets

INSULATION SHEET, MULTI-LAYER WIRING SUBSTRATE AND PRODUCTION PROCESSES THEREOF

CROSS-REFERENCE OF RELATED APPLICATION

The present application claims priority under the provision of Article 119 of U.S. Patent Law, on basis of Japanese Patent Application No. 2001-296819, entitled "Multi-Layer Wiring Substrate and Circuit Component Including Multi-Layer Wiring Substrate, and Production Processes Thereof", filed on Sep. 27, 2001, and the contents of this application are incorporated into the present specification by this citation.

FIELD OF THE INVENTION

The present invention relates to a both-sided wiring substrate (or board) in which electric connection is performed through via hole conductors provided by forming via holes through an insulating layer containing at least an organic resin, and filling the via holes with electrically conductive paste. The present invention also relates to a circuit component-including both-sided wiring substrate, a multi-layer wiring substrate and a circuit component-including multi-layer wiring substrate, and production methods of the same.

In this regard, the term "wiring substrate" used herein is already known to those skilled in the art, and various explanations are possible as to this term. For example, in the field of this art, a wiring substrate is an element which forms a variety of parts which constitutes electronic devices, and it comprises at least one insulating layer and at least one wiring layer (or a metal wiring layer) to which a via hole conductor formed through the at least one insulating layer is electrically connected.

RELATED ART

Recently, highly functional, small, thin and light electronic devices for mobile communication apparatuses represented by a cellular phone have been developed. In association with development of such electronic devices, various techniques are vigorously developed so as to make it possible to provide small and thin electronic components for composing such electronic devices. Further, various techniques are also vigorously developed so as to make it possible to provide wiring substrates which permit high density mounting of these electronic components. With rapid advance of these mounting techniques, there arise more and more demands for direct mounting of semiconductor bare chips onto wiring substrates, and demands for multi-layer wiring substrates capable of accommodating high-speed signal-processing circuits are also growing. To meet such demands, inner via hole (IVH) connection systems, which are interlayer electrical connection systems for multi-layer wiring substrates, are employed for the wiring substrates. As such wiring substrates, multi-layer wiring resin substrates which use resin materials for insulating layers, multi-layer wiring composite substrates which use mixtures of ceramic powder and resin materials for insulating layers, and the like have been provided by various manufacturing procedures.

In such multi-layer wiring substrates, electrical connection between wiring layers is made by via hole conductors. Generally, such via hole conductors are formed by: forming via holes at predetermined positions of an insulating layer which is composed of an insulation sheet formed of a thermosetting resin, or an insulation sheet which contains a thermosetting resin generally as a main component; and plating inner walls of the via holes with a metal. This process for forming the via holes, however, has problems in terms of productivity and cost; that is, chemicals for use in a chemical plating treatment are expensive, and this treatment requires much time. In a case where a wiring substrate having a plurality of wiring layers is produced, it is difficult to form via hole conductors capable of performing electrical connection at any optionally predetermined positions between the wiring layers, and therefore, it is difficult to form a wiring layer having a high density wiring pattern thereon.

To solve this problem, a process is employed that comprises steps of forming via holes at predetermined positions through an insulation sheet; filling the via holes with conductive paste which comprises an organic binder (containing a thermosetting resin as a main component) and electrically conductive powder; heating and pressing such an insulation sheet together with wiring layers, thereby heat-pressing the via holes filled with the conductive paste so as to compact the conductive powder into a high density and allow respective particles of the conductive powder to contact one another so as to form via hole conductors, and thereby electrically connect the wiring layers on both sides of the insulation sheet through such via hole conductors. This process makes it possible to form via holes at optional positions without a need of chemical treatment such as plating, to thereby make it possible to achieve a high density electrical connection in multi-layer wiring substrates.

In a case of producing a multi-layer wiring substrate in which electrical connection between wiring layers is performed by via hole conductors filled with conductive paste as mentioned above, the insulation sheet having the via holes filled with the conductive paste is heated and pressed and cured together with predetermined wiring layers. Both of thermosetting resins contained in the conductive paste and the insulation sheet are highly viscous or are practically in the form of solids at room temperature; that is, such resins are not flowable at a room temperature. However, when heated, the thermosetting resins have a lower viscosity with rise in temperature, or are melted and converted from solids into fluids having a very high viscosity (in this state, they are tacky). With further rise in temperature, viscosity of the thermosetting resins further decreases, so that, the resins are not able to, or almost unable to, maintain their forms which the resins have at a room temperature, even without any external force applied thereto(namely, naturally); that is, the resins become flowable. In this specification, since such change of the resins into becoming flowable may be referred to as apparently being melted, such apparent change is expressed by the term "melt." When the thermosetting resins are further heated after undergoing such molten states, cure of the resins practically proceeds to increase viscosity of the resins which have once lowered.

In this regard, an insulation sheet for forming an insulating layer may be formed of a mixture which contains, in addition to a thermosetting resin, a component which does not melt at a temperature that the resin encounters in the course of producing a wiring substrate. For example, the insulation sheet may contain ceramic powder in order to improve heat radiation of the substrate to be produced, and further may contain an inorganic filler, glass fibers or the like as a reinforcement in addition to or instead of the ceramic powder. A substrate comprising an insulating layer formed of such an insulation sheet is called a composite wiring substrate. This non-melted component is very small in size, and therefore, practically behaves together with the thermosetting resin when the thermosetting resin is melted. That is, while the thermosetting resin in the insulation sheet becomes flowable, the non-melted component can be flowable together with the thermosetting resin. In other words, the insulation sheet in its entirety is in a molten state and becomes flowable.

As can be understood from the above description, the term "melt" does not mean a change from a solid into a liquid as used in a strictly scientific sense, but means that the thermosetting resin or a material for forming the insulating layer becomes able to flow.

Particularly in a case of a multi-layer wiring composite substrate which comprises an insulating layer which contains a mixture of ceramic powder and resin material, an insulation sheet containing no reinforcement such as glass fibers is used in order to improve heat release of the substrate. In this case, viscosity of the insulation sheet being melted is relatively low, as compared with an insulation sheet containing a reinforcement as described above. In this regard, viscosity of the insulation sheet being melted, referred to herein, means a viscosity of materials forming the insulation sheet as a whole. For example, in a case of an insulation sheet containing a non-melted component, viscosity which is measured under a condition wherein the insulation sheet contains such a component is intended.

Therefore, when an insulation sheet having via holes filled with conductive paste is heated and pressed in the course of a process for producing a multi-layer wiring composite substrate, in which electrical connection between wiring layers through the conductive paste as via hole conductors is formed, the insulation sheet itself melts and becomes flowable. As a result, application of a sufficient pressure is impossible because shapes of the via holes tend to deform. Under an insufficient pressure, the conductive paste in the via holes cannot be sufficiently compressed up to a high density, so that there arises a problem in that highly reliable electrical connection becomes impossible, and a problem that positions of the via holes are dislocated from original positions at which the via holes have been formed through the insulation sheet, with a result of poor positional accuracy of the via holes. There is a further problem in that, when the insulation sheet melts and becomes flowable, the conductive paste overflows from the via holes and adheres to a surface of the insulation sheet and an unintended region other than a predetermined region between a wiring layer and a via hole conductor, with a result that a short circuit is formed by this attaching paste between adjacent wiring conductors.

In a case of producing a wiring substrate having a circuit component (e.g., a chip component such as a bare chip semiconductor device and LCR) embedded in an insulating layer, flowability of an insulation sheet imparted by melting of the insulation sheet is necessary for circuit components to be embedded in the insulation sheet. When a circuit component is embedded in the insulation sheet, such an amount of material of the insulation sheet that corresponds to a volume of the circuit component is pushed away, so that the material moves. The foregoing problem in association with flowing of the insulation sheet itself, therefore, becomes more serious. Therefore, it is very difficult to achieve at the same time both objects; that is, to achieve high density mounting of circuit components by embedding the circuit components in the insulation sheet, and to accomplish high density wiring by a shortest electrical connection through inner via holes filled with conductive paste.

SUMMARY OF THE INVENTION

An object of the present invention is therefore to provide a both-sided wiring substrate, a circuit component embedded both-sided wiring substrate, a multi-layer wiring substrate and a circuit component-embedded multi-layer wiring substrate, and processes for producing the same.

One aspect of the present invention is to provide an insulation sheet for use in producing a variety of wiring substrates, and this insulation sheet comprises a via hole(s) which is formed at a predetermined position(s) through the insulation sheet and filled with electrically conductive paste which has a curing-starting temperature lower than a melting-starting temperature of the insulation sheet. The insulation sheet forms an insulating layer in the wiring substrate, and for example a via hole conductor(s) formed through the via hole(s) which pass(es) through the insulating layer electrically connects wiring layers on both sides of the insulating layer to each other at a predetermined position(s). An electronic component(s) and the like is mounted on this produced wiring substrate, as required, and an electronic device is produced, using the resultant wiring substrate.

Another aspect of the present invention is to provide a process for producing the above insulation sheet, and the process comprises forming a predetermined via hole(s) through an insulation sheet, and filling the via hole(s) with a conductive paste which has a curing-starting temperature lower than a melting-starting temperature of the insulation sheet.

Figure 1:
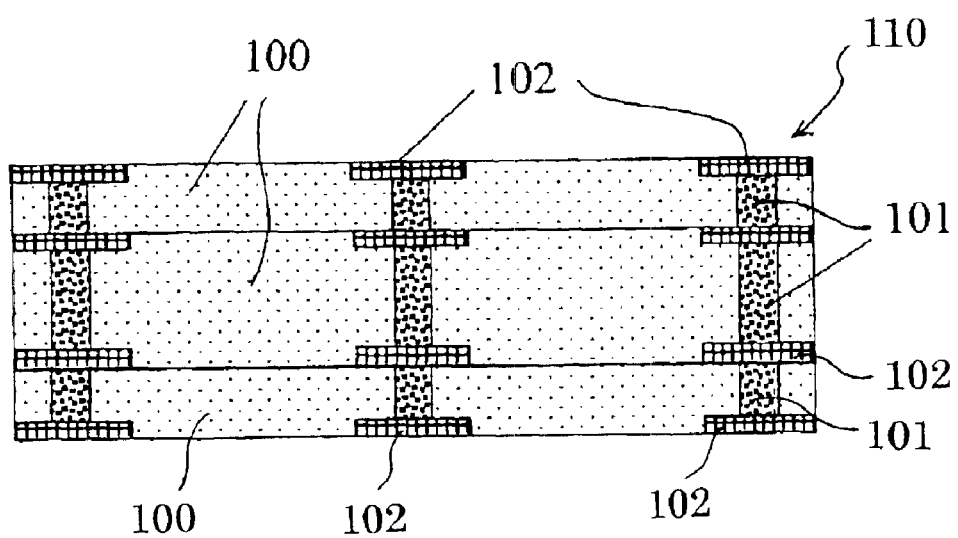
FIG. 1 is a sectional view of a multi-layer wiring substrate according to one embodiment of the present invention.

In these drawings, reference numerals represents elements as follows:

100=insulating layer, 101=via hole conductor,
102=wiring layer, 110=multi-layer wiring substrate,
200=insulating layer, 201=via hole conductor,
202=metal wiring, 203=circuit component,
210=circuit component-including multi-layer wiring substrate,
300=insulation sheet, 301=via hole, 302=via hole conductor,
303=wiring layer (or wiring), 304=release carrier,
310=insulation sheet, 315=transferable wiring pattern-including member,
320, 330 and 340=insulation sheet,
350=multi-layer wiring substrate, 400=insulation sheet, 401=via hole,
402=via hole conductor,
403=wiring layer (or wiring),
404=release carrier, 405=circuit component,
410=insulation sheet,
415 and 416=transferable wiring pattern-including member,
420, 430 and 440=insulation sheet,
450=circuit component-including multi-layer wiring substrate,
500=insulation sheet, 501=via hole,
502=via hole conductor formed by filling via hole 501 with conductive paste,
503=metal foil, 504=wiring layer (or wiring),
505=circuit component, 510, 520 and 530=insulation sheet,
540=metal foil, and 550=circuit component—including multi-layer wiring substrate.

DETAILED DESCRIPTION OF THE PREFERRED EMBODIMENTS

In the foregoing aspects of the present invention (i.e., an insulation sheet and a process for producing the same), conductive paste comprises electrically conductive powder (e.g., copper particles) and an organic binder. The organic binder contains a thermosetting resin (e.g., an epoxy resin), and may further contain a curing agent and/or a curing accelerator. The conductive paste may contain an appropriate organic solvent (e.g., butyl carbitol) in order to adjust viscosity of the paste. In the above aspects of the present invention, the conductive paste is in such a paste condition as to be filled in via holes, for example, by screen printing, and the thermosetting resin contained in the paste is not yet cured when the paste is filled in the via holes.

In the present invention, the insulation sheet contains a thermosetting resin, and if needed, other components. For example, the insulation sheet may contain ceramic powder or the like in order to accelerate heat radiation, and glass fibers or the like in order to reinforce the sheet. The conductive paste and the insulation sheet to be used in the present invention may be of the same kind or of different kinds, so long as the above relationship between a curing-starting temperature of the conductive paste and a melting-starting temperature of the insulation sheet is satisfied. Further, know n conductive paste and known insulation sheets used for producing wiring substrates by virtue of a via hole connection system may be used. In the above aspects of the present invention, the insulation sheet is a member in the form of a sheet, and the thermosetting resin contained in the insulation sheet is in an uncured state.

In another aspect, the present invention provides a process for producing a wiring substrate, in which via hole conductors formed by filling predetermined via holes with the conductive paste are electrically connected to a predetermined wiring layer disposed on at least one of main surfaces (which define the layer and are present on both sides of the layer) of the insulating layer. This process includes a step of electrically connecting, to the wiring layer disposed on the insulation sheet, the via hole conductors which are formed by filling the via holes with the conductive paste which contains a thermosetting resin and has a curing-starting temperature lower than a melting-starting temperature of the insulation sheet forming the insulating layer. This process for producing the wiring substrate comprises forming the insulation sheet of the present invention as described above, then disposing the wiring layer on at least one of the main surfaces of the insulation sheet, and electrically connecting, to the wiring layer, the via hole conductors formed of the conductive paste. In this regard, upon electrically connecting the via hole conductors to the wiring layer disposed on the insulation sheet, electrically connected portions of the wiring layer are positionally aligned relative to the via holes formed through the insulation sheet.

Therefore, the process for producing a wiring substrate of the present invention comprises (a) preparing the foregoing insulation sheet of the present invention (in which the curing-starting temperature of the conductive paste is lower than the melting-starting temperature of the insulation sheet), and (b) disposing a wiring layer on at least one of the main surfaces of the insulating layer, and electrically connecting the via hole conductors to the wiring layer. With this production process, a variety of wiring substrates can be produced thereafter through steps which will be described later.

In the present invention, "disposing the wiring layer and electrically connecting the via hole conductors to the wiring layer" may be performed by any manner so long as a connection can be so formed that current can flow in a predetermined manner between the via hole conductors formed by filling predetermined via holes with the conductive paste and the predetermined wiring layer, and thus, predetermined regions of wirings which form the wiring layer are connected to the via hole conductors. Regions other than predetermined regions of the wiring layer are bonded to the insulation sheet, and current, of course, does not flow in such regions.

In one of preferred embodiments, the predetermined wiring layer is disposed on the insulation sheet having the via holes filled with the conductive paste, and the wiring layer and the insulation sheet are pressed together while being heated (thermal-pressing) to thereby achieve an electrical connection. In this embodiment, the predetermined wiring layer, composed of various predetermined wirings, may be thermally-transferred to the insulation sheet. In a case of thermal transfer, a transferable wiring pattern-including member comprising a release carrier having a transferable metal wiring layer on its surface is thermally-pressed to transfer the metal wiring layer onto the insulation sheet, and thus, the wiring layer is formed on the insulation sheet.

In case of employing thermal transfer, it is possible to previously form fine metal wirings on a release carrier. In this regard, the transferable wiring pattern-including members may have a structure in which a transferable wiring layer is directly formed on a release carrier, or a structure in which a transferable wiring layer is formed on the release carrier through a very thin release layer. The release carrier is generally formed of a metal or a resin. The transferable wiring pattern-including member may have an electrically connected circuit component on the transferable metal wiring layer. Such a transferable wiring pattern-including member is used to embed the circuit component in the insulation sheet when the wiring layer is electrically connected to a main surface of the insulation sheet, as described later. In this case, the circuit component can be embedded in the insulating layer simultaneously with arrangement and electrical connection of the metal wiring layer.

In another preferred embodiment, a metal foil is placed on an insulation sheet having via holes filled with conductive paste, and the metal foil and insulation sheet are bonded together by heating them, and if needed, pressing them (thermal bonding), and then, the metal foil is, for example, chemically etched by a subtractive method so that only necessary regions as a predetermined wiring layer can be left to remain, and thereby, the metal foil is electrically connected to the insulation sheet. In case of employing a subtractive method such as chemical etching, less expensive metal wirings can be formed, using a metal wiring-forming etching apparatus for conventional wiring substrates as it is, particularly when a copper foil is used as the metal foil for forming the wiring layer.

In any of the above embodiments, the electrical connection between the via hole conductors and the wiring layer can be ensured, because the thermosetting resin in the binder is heated to have tackiness, and further because the conductive paste in the via hole conductors is compressed to densify the conductive powder. In addition, the thermosetting resin in the insulation sheet is heated to have tackiness, thereby contributing to bonding between the wiring layer and the insulation sheet. Therefore, the step of electrically connecting the wiring layer disposed as mentioned above is a step of thermo-compression bonding the wiring layer to the via hole conductors, and specifically a step of bonding predetermined regions of the wiring layer to the via hole conductors, and bonding other regions of the wiring layer to the insulation sheet. In the process for producing the wiring substrate of the present invention, the predetermined wiring layer (generally a metal wiring layer) is an assembly of predetermined wirings in the form of a thin layer as a whole. The wiring layer is to finally form the predetermined wirings on the insulating layer, and these wirings are disposed on one or both sides of the insulation sheet together in the form of layer(s).

In the process for producing a wiring substrate of the present invention, because of the feature of the curing-starting temperature of the conductive paste being lower than the melting-starting temperature of the insulation sheet, the conductive paste in the via holes is cured in advance by thermo-compression bonding prior to melting of the insulation sheet. Therefore, curing of the conductive paste already has proceeded at a point of time when the insulation sheet is so heated as to melt. Preferably, the curing of the conductive paste has considerably proceeded at such a point of time, or more preferably, the curing of the conductive paste has been practically completed at such a point of time. In one of the embodiments, the thermo-compression bonding is performed during a plurality of steps: that is, in a first step, the conductive paste is completely cured without practically melting the insulation sheet, and then, the insulation sheet is melted and then completely cured in at least one of following steps.

As a result, the following effect is produced:
Even if applied heat finally melts the insulation sheet, an adverse influence of the insulation sheet becoming flowable on the via hole conductors can be suppressed to a minimum.
(A) in the course of thermo-compression bonding performed for the above electrical connection, or
(B) as will be described later,
(a) when a both-sided circuit substrate or a single-sided circuit substrate is produced by continuing the thermo-compression bonding performed for the electrical connection under conditions which are the same as, or different from, those upon the thermo-compression bonding after the thermo-compression boding performed for the electrical connection, or
(b) when a multi-layer wiring circuit substrate is produced by further performing the thermo-compression bonding together with at least one other insulting sheet (corresponding to a third insulation sheet as described later) after the thermo-compression boding performed for the above electrical connection. To distinguish the thermo-compression bonding which is further performed in the above case (a) or (b); that is, the thermo-compression bonding performed after the thermo-compression bonding for electrical connection, is referred to as "post-thermo-compression bonding" in the present specification.

Particularly when the insulating layer obtained by electrically connecting the via hole conductors to the wiring layer is thereafter subjected to the post-thermo-compression bonding, shapes of the via hole conductors are hard to deform, and thus, an influence of the insulation sheet becoming flowable can be advantageously avoided. Particularly in a case where curing of the thermosetting resin in the binder already has sufficiently proceeded during the course of the electrical connection, the conductive paste in the via holes has become hard. Therefore, no substantial change in the shapes of the via hole conductors is caused.

In the above process for producing the wiring substrate, as mentioned above, it is preferable that curing of the thermosetting resin in the binder practically proceeds during the course of the thermo-compression bonding for electrically connecting the via hole conductors to the wiring layer, and more preferable that the curing of the thermosetting resin in the binder has been practically completed during the course of the same thermo-compression bonding. In this course of the thermo-compression bonding, curing of the thermosetting resin in the insulation sheet may practically proceed or may not proceed. However, this thermosetting resin is not allowed to be completely cured. For example, the insulation sheet may be in a semi-cured condition by the thermo-compression bonding, and such semi-cured condition is preferable in some cases. Those skilled in the art could select the curing state of the thermosetting resin in the insulation sheet after subjected to the electrical connection, in accordance with how to use the insulation sheet which has undergone the electrical connection.

In one of the embodiments of the above process for producing the wiring substrate, (c) a wiring substrate is obtained by further subjecting only the insulation sheet which has undergone the electrical connection (referred to as a first insulation sheet for clearly distinguishing this sheet) to the post-thermo-compression bonding, thereby completing curing of the thermosetting resin in the insulation sheet for obtaining the wiring substrate. In this case, a single-sided wiring substrate or a both-sided wiring substrate can be obtained when wiring layer(s) is, or are, disposed on one or both sides of the insulation sheet, respectively, and electrically connected.

In this case, the post-thermo-compression bonding may be performed by continuing the thermo-compression bonding under the same conditions as in the first thermo-compression bonding for the electrical connection. In other words, the first thermo-compression bonding is continued until curing of the insulation sheet is completed to thereby perform the post-thermo-compression bonding. Needless to say, heating and pressing may be performed in two or more steps under conditions for the post-thermo-compression bonding, which are different from conditions for the first thermo-compression bonding. For example, during the first thermo-compression bonding, only the conductive paste is sufficiently cured, and during the post-thermo-compression bonding, the insulation sheet alone is substantially cured.

At least one other insulation sheet (referred to as a second insulation sheet for clearly distinguishing this sheet) which is incompletely cured is aligned relative to and laminated onto at least one of main surfaces of the above single sided or both-sided wiring substrate, and subjected to a thermo-compression bonding treatment (the word "treatment" is added to clearly distinguish this procedure from "the thermo-compression bonding" which the insulating layer firstly undergoes, and "the post-thermo-compression bonding" which the insulating layer undergoes thereafter) to thereby be bonded together to obtain a multi-layer wiring substrate. This second insulation sheet is not particularly limited in selection of type and number of sheets, so long as a desired multi-layer wiring substrate can be obtained by laminating this insulation sheet onto the single-sided wiring substrate or the both-sided wiring substrate, and then subjecting this resultant laminate to the thermo-compression bonding treatment. In this connection, a plurality of the second insulation sheets may be laminated onto the wiring substrate. Generally, the second insulation sheet has via hole conductors formed by filling via holes with a conductive paste, and may have a wiring layer electrically connected to the via hole conductors, on at least one of main surfaces of the insulating layer. Therefore, the second insulation sheet may have no wiring layer on either side thereof, while, however, if needed, the second insulation sheet may have wiring layer(s) on one side or both sides thereof. The number of the second insulation sheets and the kind thereof are selected so that all the wiring layers can be electrically connected in a predetermined manner when the second insulation sheet(s) together with the single-sided wiring substrate or the both-sided wiring substrate are subjected to the thermo-compression bonding treatment to obtain the multi-layer wiring substrate. In the above single-sided or both-sided wiring substrate of the present invention, curing of the insulation sheet has been completed, and therefore, the second insulation sheet is not completely cured, and preferably, it is uncured or semi-cured.

Concretely, the above process for producing the multi-layer wiring substrate comprises:

(d) laminating at least one second insulation sheet which has via hole conductors, and if needed, a wiring layer electrically connected to the via hole conductors, on at least one of the main surfaces thereof, onto at least one of main surfaces of the above single-sided or both-sided wiring substrate, (e) upon such lamination, (e-1) aligning the single-sided or both-sided wiring substrate relative to the second insulation sheet to be laminated thereon, so that (i) predetermined regions of the wiring layer of the single-sided or both-sided wiring substrate can be electrically connected to the via hole conductors of the second insulation sheet in a predetermined manner by the post-thermo-compression bonding treatment which will be subsequently performed, or that (ii) the via hole conductors of the single-sided or both-sided wiring substrate can be electrically connected to the predetermined regions of the wiring layer of the second insulation sheet adjacent thereto in a predetermined manner by the thermo-compression bonding treatment which will be subsequently performed; and (e-2) aligning a remaining other second insulation sheet so that the second insulation sheets can be electrically connected to each other in a predetermined manner by a subsequent thermo-compression bonding treatment which will be subsequently performed; and (f) subjecting the laminate of the single-sided or both-sided wiring substrate and the second insulation sheet(s) to the thermo-compression bonding treatment to obtain a multi-layer wiring substrate.

In (e-1), item (i) corresponds to a case where a main surface of the first insulation sheet which is opposite to the second insulation sheet has the wiring layer thereon, and in such a case, a main surface of the second insulation sheet which is opposite to the first insulation sheet has no wiring layer. Thus, the wiring layer of the first insulation sheet is electrically connected to the via hole conductors of the second insulation sheet by thermo-compression bonding.

In (e-1), item (ii) corresponds to a case where a main surface of the first insulation sheet which is opposite to the second insulation sheet has no wiring layer, and in such a case, a main surface of the second insulation sheet which is opposite to the first insulation sheet has a wiring layer thereon. Thus, the via hole conductors of the first insulation sheet are electrically connected to the wiring layer of the second insulation sheet by performing thermo-compression bonding.

In (e-2) is performed in a case where a plurality of the second insulation sheets are laminated and the second insulation sheet which is not directly adjacent to the single-sided or both-sided wiring substrate must also be electrically connected in a predetermined manner.

In another embodiment of the process for producing the wiring substrate of the present invention, at least one other insulation sheet (referred to as a third insulation sheet for distinguishing this sheet from the above second insulation sheet) is laminated onto the insulation sheet obtained after undergoing electrical connection (i.e., after performing thermo-compression bonding) (also, referred to as a first insulation sheet), and these insulation sheets are integrally subjected to post-thermo-compression bonding to thereby produce the multi-layer wiring substrate. The third insulation sheet may be the same as the above mentioned second insulation sheet except that a curing state of the third insulation sheet (specifically the curing state of thermosetting resin in the third insulation sheet) may be in any state. Therefore, the foregoing description as to the second insulation sheet can be applied to the third insulation sheet except for the curing state thereof.

The third insulation sheet contains a thermosetting resin, and has via holes at predetermined positions which are filled with conductive paste to form via hole conductors. The third insulation sheet may have a predetermined wiring layer on at least one side thereof as required, and the via hole conductors formed by filling the via holes with the conductive paste are electrically connected to the wiring layer. Therefore, the third insulation sheet may have predetermined wiring layers on both main surfaces thereof (these wiring layers being electrically connected to the via hole conductors) or may have a predetermined wiring layer on one of the main surfaces thereof (this wiring layer being electrically connected to the via hole conductors), or may have no wiring layer thereon.

In a case where the multi-layer wiring substrate is produced, curing of the first insulation sheet obtained by the process of the present invention has not yet been completed after electrical connection (i.e., uncured or semi-cured), and therefore, the first insulation sheet can be laminated onto the third insulation sheet and subjected to thermo-compression bonding integrally, even though the third insulation sheet is in a curing state. Generally, it is preferable that the third insulation sheet is cured or semi-cured.

The above process for producing the multi-layer wiring substrate comprises: (D) laminating at least one third insulation sheet which has via hole conductors and if needed, a wiring layer electrically connected to the via hole conductors on at least one of main surfaces thereof, onto at least one of main surfaces of the first insulation sheet obtained after performing thermo-compression bonding, (E) upon such lamination, (E-1) aligning the first insulation sheet relative to the third insulation sheet to be laminated thereonto, so that (i) predetermined regions of the wiring layer of the first insulation sheet can be electrically connected to via hole conductors of the third insulation sheet to be laminated thereonto in a predetermined manner by post-thermo-compression bonding which will be subsequently performed; or so that (ii) the via hole conductors of the first insulation sheet can be electrically connected to predetermined regions of the wiring layer of another insulation sheet adjacent to the first insulation sheet in a predetermined manner by the post-thermo-compression bonding which will be subsequently performed; and (E-2) aligning the remaining other third insulation sheet so that the third insulation sheets can be electrically connected to each other in a predetermined manner by the post-thermo-compression bonding which will be subsequently performed; and (F) subjecting this resultant laminate of the first insulation sheet and the third insulation sheet(s) to the post-thermo-compression bonding to obtain a multi-layer wiring substrate.

In (E-1), item (i) corresponds to a case where a main surface of the first insulation sheet which is opposite to the third insulation sheet has a wiring layer thereon, and in such a case, a main surface of the third insulation sheet which is opposite to the first insulation sheet has no wiring layer. Thus, the wiring layer of the first insulation sheet is electrically connected to the via hole conductors of the third insulation sheet by post-thermo-compression bonding.

In (E-1), item (ii) corresponds to a case where the main surface of the first insulation sheet which is opposite to the third insulation sheet has no wiring layer, and in such a case, the main surface of the third insulation sheet which is opposite to the first insulation sheet has a wiring layer thereon. Thus, the via hole conductors of the first insulation sheet are electrically connected to the wiring layer of the third insulation sheet by post-thermo-compression bonding.

In (E-2) is performed in a case where a plurality of third insulation sheets are laminated and the insulation sheet which is not directly adjacent to a single-sided or both-sided wiring substrate must be electrically connected in a predetermined manner.

Accordingly, the above process for producing the wiring substrate of the present invention includes laminating the insulation sheet obtained after undergoing electrical connection of the via hole conductor to the wiring layer, that is, any one of the foregoing various first insulation sheets, onto at least one other insulation sheet, i.e., the third insulation sheet; and further subjecting a laminate of these insulation sheets to thermo-compression bonding, i.e., to post-thermo-compression bonding to thereby integrally cure the first insulation sheet and the third insulation sheet to obtain the wiring substrate, i.e., a multi-layer wiring substrate.

In a case where the first insulation sheet laminated onto the third insulation sheet is subjected to post-thermo-compression bonding, needless to say, the first insulation sheet and the third insulation sheet are aligned relative to each other so that wiring layers of the first insulation sheet and the third insulation sheet to be laminated onto each other can be electrically connected to each other through the via hole conductors in a predetermined manner, and then subjected to post-thermo-compression bonding.

In this regard, the above post thermo-compression bonding may be performed during a plurality of steps. In a case where the conductive paste has not been completely cured, the conductive paste is completely cured during a first step without practically melting the insulation sheet or without allowing curing of the insulation sheet to practically proceed, and then, the insulation sheet is melted during at least one of the following steps, and then completely cured.

The second or third insulation sheet laminated as above is preferably an insulation sheet which is the same one as the insulation sheet electrically connected according to the foregoing process for producing the wiring substrate of the present invention (that is, the first insulation sheet). That is, it is preferable that the curing-starting temperature of the conductive paste of the second or third insulation sheet is lower than the melting-starting temperature of the insulation sheet. If needed, such a third insulation sheet may have a circuit component embedded therein as described below.

Alternatively, the second or third insulation sheet may be a separately produced insulation sheet which is so designed as to be laminated onto the first insulation sheet obtained after undergoing electrical connection by the foregoing process of the present invention, and to be subjected to thermo-compression bonding or post-thermo-compression bonding. In a further embodiment, the second or third insulation sheet may be an insulation sheet which has a plurality of insulating layers and a multi-layer wiring having predetermined wiring layers disposed between two of the plurality of insulating layers. It is possible to appropriately select a kind of the third insulation sheet and a number of other insulation sheets in accordance with a wiring substrate which is intended be produced.

In the process for producing the wiring substrate of the present invention, when thermo-compression bonding performed for electrical connection is such that an insulation sheet is not caused to melt, the insulation sheet is melted by post-thermo-compression bonding, and then, curing of thermo-curable resin proceeds. Also, when thermo-compression bonding performed for electrical connection is such that an insulation sheet is caused to melt, curing of the insulation sheet is allowed to further proceed by post-thermo-compression bonding up to a sufficient degree. When curing of conductive paste is not sufficiently proceeded by the thermo-compression bonding performed for the electrical connection, curing of the conductive paste is allowed to further proceed by the post-thermo-compression bonding up to a sufficient degree. Because of the feature of the present invention that the curing-starting temperature of the conductive paste is lower than the melting-starting temperature of the insulation sheet, curing of the conductive paste has already started before the insulation sheet starts melting. Therefore, the problems in association with melting of the insulation sheet are at least alleviated.

In one of the preferred embodiments of the process for producing the wiring substrate of the present invention, the wiring layer which is electrically connected to the via hole conductors formed inside the via holes provided through the insulation sheet (i.e., the wiring layer disposed on the first insulation sheet) may have at least one circuit component which is electrically connected to the wiring layer in advance (for example, a bare chip semiconductor device, a chip functioning as a resistor, a chip functioning as a capacitor, a chip functioning as an inductor, an LCR chip or the like). In this embodiment, when the wiring layer is disposed on the insulation sheet and electrically connected to the via hole conductors, the wiring layer is exposed on the surface of the insulation sheet and the circuit component is embedded in the insulation sheet. Concretely, the wiring layer is thermally-transferred to the insulation sheet as follows: a transferable wiring layer support carrier, which has thereon a wiring layer having a circuit component electrically connected thereto in advance, is so disposed on the insulation sheet that the wiring layer can be exposed after thermal transfer, and then subjected to thermo-compression bonding; and thereafter, the carrier is released. Therefore, according to this embodiment of the process, when the wiring layer on at least one of the main surfaces of the insulation sheet is electrically connected to the via hole conductors of the insulation sheet, the circuit component is embedded in the insulation sheet, and the wiring layer electrically connected to the circuit component is exposed on the surface of the insulation sheet. In this embodiment, it is necessary for thermo-compression bonding to be performed under a condition which allows the insulation sheet to melt, in order to embed the circuit component in the insulation sheet, with curing of the insulation sheet proceeding or not proceeding, but complete curing of the insulation sheet is not permitted. Even, in this case, curing of the conductive paste has already started and proceeded before the insulation sheet starts melting because of the foregoing features of the present invention. Therefore, adverse influences caused by melting of the insulation sheet are alleviated.

The insulation sheet having a circuit component embedded therein as described above (corresponding to the first insulation sheet) is substantially the same as the foregoing insulation sheet (i.e., the first insulation sheet), except for a different point in that the circuit component is electrically connected to the wiring layer in advance (which requires the insulation sheet to be melted, so as to embed the circuit component in the insulation sheet). Accordingly, the foregoing explanation can be applied to an insulation sheet having the circuit component embedded therein except for this different point. Thus, the insulation sheet having the circuit component embedded therein can be used for production of a both-sided or single-sided wiring substrate, or a multi-layer wiring substrate. For example, this insulation sheet is combined with another insulation sheet, i.e., the foregoing second or third insulation sheet and laminated thereonto, and subjected to thermo-compression bonding or post-thermo-compression bonding. Thus, a multi-layer wiring substrate having a circuit component embedded therein can be provided.

In a further embodiment of the process of the present invention, at least one circuit component is electrically connected to the wiring layer of the insulation sheet having the via hole conductors which are electrically connected to the wiring layer, that is the first insulation sheet (the circuit component is therefore located outside the insulation sheet, in other words, exposed to the outside), and this first insulation sheet having the circuit component electrically connected thereto is laminated onto at least one other insulation sheet (which may be the third insulation sheet as described above) and together subjected to post-thermo-compression bonding. Thus, a multi-layer wiring substrate having a circuit component embedded therein can be provided. In this embodiment, the insulation sheet is melted by post-thermo-compression bonding to thereby allow the circuit component to be embedded therein.

In any of the above embodiments of the present invention, the via hole conductors, formed of the conductive paste which starts curing at a temperature lower than the melting-starting temperature of the insulation sheet which forms an insulating layer and contains a thermosetting resin, are electrically connected to a wiring layer disposed on the insulation sheet. Therefore, the conductive paste has been cured, preferably sufficiently cured, before the insulation sheet melts and flows. Thus, shapes of the via hole conductors are prevented from deforming because of the insulation sheet becoming flowable, and it becomes possible to sufficiently compress the via hole conductors which are formed by filling via holes with conductive paste. As a result, a single-sided wiring substrate, a both-sided wiring substrate, a multi-layer wiring substrate, and these wiring substrates each having a circuit component embedded therein, in all of which highly reliable electrical connections are achieved, can be provided. Therefore, the present invention also provides a single-sided wiring substrate, a both-sided wiring substrate and a multi-layer wiring substrate which are all produced by the foregoing processes and which may optionally include circuit components.

In the present invention, the melting-starting temperature of the insulation sheet is defined as a temperature at which a viscosity of the insulation sheet, found at a predetermined temperature, decreases to a certain rate with a rising temperature. According to the present invention, the melting-starting temperature is a temperature at which viscosity at room temperature (about 30° C.) decreases to one-hundredth (1/100). As a result of further intensive research, it has been discovered to be more preferable that the melting-starting temperature is determined as a temperature at which viscosity at 50° C. decreases to one-fiftieth (1/50). When a change of viscosity of the insulation sheet is measured, a flow tester (Shimadzu Flow Tester CFT-500D manufactured by Shimadzu Corporation) is used as a measurement instrument.

Figure 6:
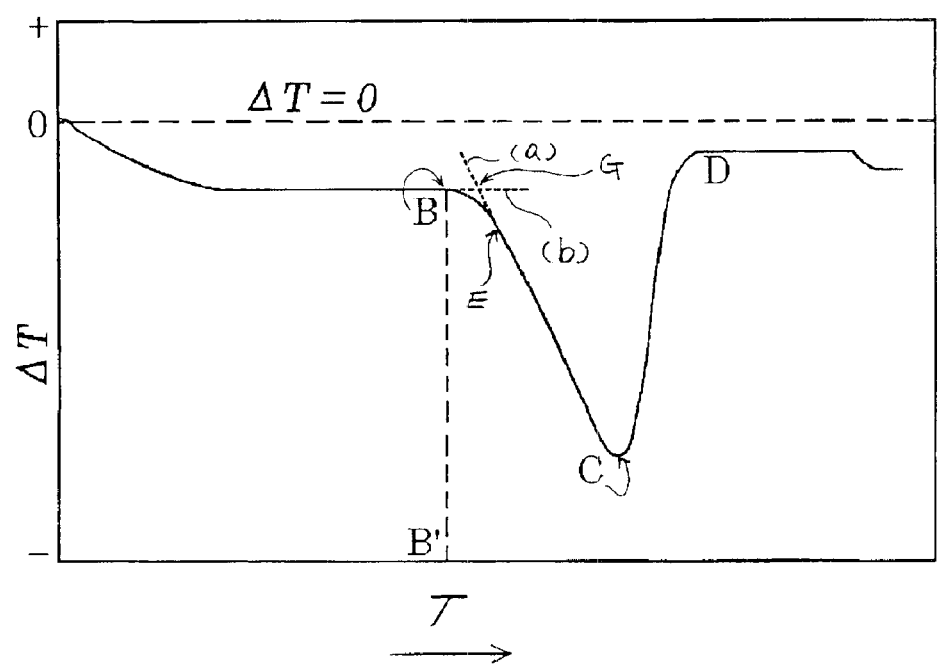
FIG. 6 shows a DTA curve indicating a curing-starting temperature of conductive paste.

In the present invention, the curing-starting temperature of the conductive paste is defined as follows, with reference to FIG. 6:

The conductive paste is subjected to differential thermal analysis (heated at a rate of 5° C./min. from 30° C. to 250° C. (equivalent to a temperature not lower than a curing-starting temperature) to obtain a differential thermal curve (temperature (T, axis of abscissa) vs difference in temperature ($\Delta$T, axis of ordinate) as diagrammatically shown in FIG. 6. Regarding a portion indicating a peak of the curve (the lowermost peak seen in FIG. 6), a decreasing point (B) of the curve (from which point, the difference in temperature ($\Delta$T) abruptly becomes larger) is determined. Next, the curing-starting temperature is defined as a temperature which is found at intersection (G) of an extrapolated tangent line (a) drawn at maximal gradient point (E) within a region from point (B) to peak point (C) and an extrapolated tangent line (b) drawn from point (B). This differential thermal curve is obtained, using a thermal analysis instrument (a differential thermo/thermogravity-co-measuring instrument TG/DTA200 manufactured by Seiko Instruments Inc.), and the above curing-starting temperature can easily be calculated by software combined in the instrument.

According to the present invention, the curing-starting temperature of the conductive paste is lower than the melting-starting temperature of the insulation sheet, and preferably at least 5° C., more preferably at least 10° C., lower than the melting-starting temperature of the insulation sheet. The larger this difference in temperature, the more preferable. However, if this difference in temperature is too large, there arises a disadvantage in that a temperature of post-cure is too high. In one of the embodiments, the curing-starting temperature of the conductive paste is, for example, 8 to 15° C. lower than the melting-starting temperature of the insulation sheet. Those skilled in the art can appropriately set the curing-starting temperature of the conductive paste and the melting-starting temperature of the insulation sheet by selecting kinds of components forming these materials, and their compositions.

EMBODIMENTS FOR CARRYING OUT THE INVENTION

In one of the preferred embodiments, the multi-layer wiring substrate of the present invention comprises: at least two insulating layers, each formed of an insulation sheet of a mixture containing an inorganic filler (preferably 50 to 75 vol. % or 70 to 95 wt. % based on volume or weight of the mixture) and a thermosetting resin; wiring layers (generally metal wiring layers) two of which sandwich each of the insulating layers; and via hole conductors passing through the insulating layers so as to be electrically connected to the wiring layers. The via hole conductors are formed by filling via holes with conductive paste which contains at least conductive powder and an organic binder, and starts curing at a temperature lower than a melting-starting temperature of the insulation sheets.

The via hole conductors, formed of the conductive paste which starts curing at a temperature lower than the melting-starting temperature of the insulation sheets, can effectively maintain their shapes against melting and flowing of the insulation sheets, because the conductive paste has started curing before the insulation sheets start melting. Thus, it becomes possible to sufficiently compress the via hole conductors to thereby compact the conductive powder in the conductive paste to a high density. Therefore, a multi-layer wiring substrate which has low resistance and highly reliable electrical connection therein can be provided. Further, since shapes of the via hole conductors can be maintained, the via hole conductors are not dislocated by flowing of a molten insulation sheet, and thus, positional accuracy of the via hole conductors is improved.

In the present invention, it is preferable that the curing-starting temperature of the conductive paste is in the range of 50 to 150° C. It is generally required for the conductive paste to have a viscosity sufficient to be filled into the via holes, and specifically to maintain a viscosity of 10 to 500 Pa.s at a room temperature for at least a half day. If the curing-starting temperature is lower than 50° C., it is hard to maintain stock stability of the conductive paste of room temperature. On the other hand, if the curing-starting temperature is higher than 150° C., the conductive paste cannot be sufficiently cured before a insulation sheet starts melting, which contains a mixture of, for example, an inorganic filler and a thermosetting resin. As a result, it cannot be expected that shapes of the via hole conductors, formed by filling via holes with the conductive paste, are sufficiently maintained while the insulation sheet becomes flowable. It is particularly preferable that the curing-starting temperature of the conductive paste is 70 to 120° C. Further preferably, the curing-starting temperature of the conductive paste is 80 to 100° C.

In the present invention, the electrically conductive paste contains 80 to 97 wt. %, preferably 85 to 95 wt. % of electrically conductive powder (or electrically conductive particles), and 3 to 20 wt. %, preferably 5 to 15 wt. % of an organic binder. One example of the conductive paste contains 80 to 95 wt. % of the conductive powder and 5 to 20 wt. % of the organic binder. If the amount of the conductive powder is larger than 97 wt. %, it becomes hard to form the conductive powder into a paste form. On the contrary, if the amount of the conductive powder is smaller than 80 wt. %, a large amount of organic binder remains in the via hole conductors, when the via hole conductors, which are formed by filling via holes with the conductive paste, are cured. As a result, individual particles of the conductive powder are hindered from contacting one another, which leads to higher electrical resistance of the via hole conductors. The conductive paste may further contain a suitable amount of an organic solvent for adjusting viscosity, such as butyl carbitol, butyl carbitol acetate or the like.

The conductive powder in the conductive paste is powder of at least one metal selected from the group consisting of gold, silver, palladium, copper, nickel, tin, lead, and alloys thereof. Alternatively, the conductive powder may be a mass of particles each of which comprises a core of a metal selected from the above group, and a coating of another metal selected therefrom. In view of electrical conductivity, silver is superior, and use of silver is advantageous for via hole conductors to have lower resistance. In a case where conductive powder of a soft metal is used, particles of the conductive powder can have increased contact areas therebetween, and therefore provide lower resistance when the via hole conductors, which are formed by filling via holes with the conductive paste, are compressed. Therefore, gold and silver are suitable, and copper is superior in view of cost. Further suitable conductive powder is a mass of particles each of which comprises a core of copper and a coating of silver, because this powder has both merits of copper and silver.

In the present invention, preferably, the organic binder in the conductive paste contains at least one thermosetting resin such as an epoxy resin, a phenol resin, a cyanate resin and a polyphenylene ether resin. A mixture of an epoxy resin and a phenol resin is more preferable as the thermosetting resin, and a mixing ratio of the epoxy resin to the phenol resin (weight ratio) is preferably 1:4 to 4:1. This is because use of the epoxy resin alone is effective to obtain a binder having excellent electrical insulation; however, such a binder has no function to reduce oxidized conductive powder (metal powder) in the conductive paste, and because use of the phenol resin alone is effective to obtain a binder excellent in reducing ability. However, such a binder has defects in that the resin itself is brittle and must be dissolved in a solvent since it is generally in the form of a solid. The epoxy resin to be used may be one of known resins such as glycidyl ether type epoxy resins, alicyclic epoxy resins, and glycidylamine type epoxy resins (e.g., Bisphenol A type, Bisphenol F type, Novolac type, Lesol type, and the like).

In the present invention, the organic binder preferably contains a curing catalyst or a curing accelerator which is composed of at least one compound selected from the group consisting of amine compounds, imidazoles, imidazole derivatives and onium salts. It is suitable to use an imidazole which is in the form of a solid at room temperature in view of stock stability. Such an imidazole is dissolved in an organic resin when heated to a predetermined temperature or higher, and quickly accelerates curing of the conductive paste. An onium salt type catalyst or accelerator is low in activity at room temperature, and thus excellent in terms of stock stability. Further, to improve response to a temperature, it is effective to increase concentration of a curing agent or curing catalyst in the resin. For example, in a case of using an imidazole as the curing catalyst, an amount of the imidazole to be added for curing the thermosetting resin is normally 0.5 to 2 parts by weight, preferably 3 to 20 parts by weight, and more preferably 5 to 15 parts by weight (based on 100 parts by weight of the thermosetting resin). This amount of the imidazole is effective to ensure starting of curing of the conductive paste at a temperature lower than the melting-starting temperature of the insulation sheet, and also to quicken curing of the conductive paste and improve stock stability of the conductive paste.

In the present invention, the thermosetting resin contained in the insulation sheet preferably comprises at least one thermosetting resin selected from epoxy resins, phenol resins and cyanate resins. By using such a resin selected from the above, a wiring substrate excellent in terms of heat resistance and electrical insulation can be provided.

In the present invention, the insulation sheet preferably contains an inorganic filler which is preferably at least one selected from $Al_2O_3$, $SiO_2$, MgO, BN and AlN. The insulation sheet can have an excellent heat radiation property by containing such an inorganic filler. In a case of using $SiO_2$ as the inorganic filler, a resultant substrate can have a small dielectric constant. The insulation sheet may further contain a reinforcement such as glass fibers or the like. The insulation sheet, if needed, may contain other components such as a coupling agent for improving dispersibility of the inorganic filler in the resin, carbon black for coloring the resin, and the like.

In one of the embodiments of the process for producing the multi-layer wiring substrate of the present invention, there is produced a multi-layer wiring substrate in which metal wiring layers are electrically connected to each other through an insulating layer by via hole conductors which are formed by filling via holes with conductive paste containing at least conductive powder and an organic binder. The process for producing such a multi-layer wiring substrate comprises:

(a) forming via holes through an uncured or semi-cured insulation sheet which is formed of a mixture containing 50 to 75 vol. % of an inorganic filler and a thermosetting resin, (b) filling the via holes with conductive paste, which starts curing at a temperature lower than a melting-starting temperature of the insulation sheet, to form via hole conductors, (c) forming metal wiring layers on main surfaces of the insulation sheet having the via hole conductors so that the metal wiring layers can be electrically connected to each other through the insulation sheet by the via hole conductors, and (d) preparing a predetermined number of the insulation sheet(s) which is obtained during step (c), and if needed, preparing a predetermined number of other insulation sheet(s); aligning these insulation sheets with one another, and laminating them onto one another; and heating and pressing this laminate to thereby cure the thermosetting resin to bond together these insulation sheets so as to obtain an integrated article as the multi-layer wiring substrate.

This resultant integrated article has, on its expressed surface, the metal wirings which are located at an outermost portion of the laminate of the insulation sheets, as the metal wirings on the exposed surface of the multi-layer wiring substrate. In this regard, another insulation sheet used during step (d) may be the third insulation sheet described above, or any insulation sheet (if needed, having a wiring layer and/or a circuit component and/or via hole conductors) which is necessary to produce a predetermined multi-layer circuit substrate using the insulation sheet obtained during step (c).

By using conductive paste which starts curing at a lower temperature than the melting-starting temperature of the insulation sheet, curing of the conductive paste has proceeded before the insulation sheet melts and flows, when the insulation sheet is heat-pressed and cured. Therefore, it becomes possible to maintain shapes of the via hole conductors against flowing of the insulation sheet. Under an effect of the via hole conductors' maintaining their shapes against flowing of the insulation sheet, the via hole conductors can be sufficiently compressed by compression of the insulation sheet in a thickness direction, compression of metal wirings into the via holes and so on. Thus, the conductive powder of the via hole conductors is compacted into a high density with a result that electrical connection by the via hole conductors can be obtained with lower resistance and higher reliability. Further, even in a case where intervals between the via holes formed through the insulation sheet are small, dislocation of the via holes in association with flowing of the insulation sheet hardly occurs. Therefore, electrical connection between metal wiring and the via hole conductors can be obtained with excellent positional accuracy. Further, a failure in connection such as a short circuit of adjacent wiring circuits or the like is suppressed. Such failure is caused when the conductive paste in the via hole conductors flows out to adhere to a surface area of the insulation sheet between wiring conductors upon flowing of the insulation sheet.

In one embodiment of the process for producing the circuit component-embedded multi-layer wiring substrate of the present invention, a circuit component-embedded multi-layer wiring substrate is produced in which the circuit component is embedded in an insulating layer, and electrical connection between the metal wiring layers is performed through the insulating layer by virtue of via hole conductors which are formed by filling via holes with conductive paste containing at least conductive powder and the organic binder. The process comprises:

(a) forming the via holes through an uncured or semicured insulation sheet which is formed of a mixture containing 50 to 75 vol. % of an inorganic filler and a thermosetting resin, (b) filling the via holes with the conductive paste which starts curing at a temperature lower than a melting-starting temperature of the insulation sheet so as to form the via hole conductors, (c) disposing a metal wiring, to which the circuit component has been electrically connected in advance, on at least one of main surfaces of the insulation sheet having the via hole conductors formed by filling the via holes with the conductive paste so that electrical connection between wiring layers can be performed by the via hole conductors; and simultaneously embedding, in the insulation sheet, the circuit component which is electrically connected to the wiring layer in advance, and (d) preparing a predetermined number of such insulation sheet(s) each of which is obtained during step (c), and if needed, preparing a predetermined number of other insulation sheet(s); aligning these insulation sheets with one another, and laminating them onto one another; and heating and pressing this laminate to thereby cure the thermosetting resin to bond together the insulation sheets so as to obtain an integrated article as the multi-layer wiring substrate.

This resultant integrated article has, on its exposed surface, the metal wirings which are exposed at an outermost portion of the laminate of the insulation sheets, as the metal wirings on the exposed surface of the multi-layer wiring substrate. In this regard, the other insulation sheets used during step (d) may be the third insulation sheet described above, or any insulation sheet (if needed, having a wiring layer and/or a circuit component and/or via hole conductors)

which is necessary to produce a predetermined multi-layer circuit substrate using the insulation sheet obtained during step (c).

In another embodiment of the process for producing the circuit component embedded multi-layer wiring substrate of the present invention, a circuit component-including multi-layer wiring substrate is produced in which a circuit component is embedded in an insulating layer and electrical connection between metal wiring layers is performed through the insulating layer by virtue of via hole conductors which are formed by filling via holes with conductive paste containing at least conductive powder and an organic binder. The process comprises:

(a) forming the via holes through an uncured or semi-cured insulation sheet which is formed of a mixture containing 50 to 75 vol. % of an inorganic filler and a thermosetting resin, (b) filling the via holes with the conductive paste which starts curing at a temperature lower than a melting-starting temperature of the insulation sheet so as to form the via hole conductors, (c) disposing a metal wiring on at least one of main surfaces of the insulation sheet having the via hole conductors formed by filling the via holes with the conductive paste so that electrical connection between wiring layers can be performed by the via hole conductors, (d) mounting a circuit component on metal wiring disposed on the insulation sheet; that is, electrically connecting the circuit component to this metal wiring, (e) aligning, with the surface of the insulation sheet having the circuit component mounted thereon, another insulation sheet which is prepared during steps (a) and (b) and which has via hole conductors formed by filling via holes with the conductive paste so that a surface of the metal wiring having the circuit component mounted thereon can be in contact with the via hole conductors of this another separate insulation sheet, and laminating these insulation sheets to obtain a laminate, and (f) heating and pressing the laminate to cure thermosetting resin thereof.

By using conductive paste which starts curing at a temperature lower than a melting-starting temperature of the insulation sheets, curing of the conductive paste has proceeded before the insulation sheets flow, when the insulation sheets are heated and pressed and cured. Therefore, the via hole conductors can maintain their shapes against not only flowing of molten insulation sheets but also additional flowing of the insulation sheets which is caused in association with embedding of a circuit component in the insulation sheet. By this effect of the via hole conductors' maintaining their shapes against flowing of the insulation sheet in association with embedding of the circuit component, a shortest electrical connection is achieved by the via hole conductors filled with the conductive paste on the same insulation sheet having the circuit component embedded therein. Further, embedding of the circuit component in the insulation sheet can be performed without adding a special step to production steps for producing a wiring substrate including no circuit component.

In any of the various processes for producing the circuit substrates of the present invention, thermo-compression bonding and post-thermo-compression bonding are performed by heating and pressing at least two times. For example, a first heating and pressing is performed at a temperature higher than a curing temperature of the conductive paste and lower than a melting-starting temperature of a corresponding insulation sheet, so that only via hole conductors formed by filling via holes with the conductive paste are cured; and the insulation sheet is cured by a second or any of subsequent heating and pressing. Thus, the via hole conductors have been sufficiently cured before the insulation sheet which forms an insulating layer flows, and this further enhances an effect of the via hole conductors' maintaining their shapes against flowing of the insulation sheet. This is particularly effective when the via hole conductors and the insulation sheet having the circuit component embedded therein are cured, because flowing of such an insulation sheet is remarkable.

Hereinafter, concrete embodiments of the present invention will be explained in more detail with reference to the accompanying drawings.

Concrete Embodiment 1 for Carrying out the Invention)

FIG. 1 schematically shows a sectional view of a multi-layer wiring substrate (110) (four layers in the shown embodiment) according to one embodiment of the present invention. The wiring substrate (110) comprises insulating layers (100) formed of insulation sheets, via hole conductors (101) formed by filling via holes with conductive paste which starts curing at a temperature lower than a melting-starting temperature of the insulation sheets, and wiring layers (102) which provide metal wirings.

In the present invention, the via hole conductors (101) are formed of the conductive paste which starts curing at a temperature lower than the melting-starting temperature of the insulation sheets. By doing so, the via hole conductors can have an effect to maintain their shapes against melting and flowing of the insulation sheets. As a result, the via hole conductors comprising the conductive paste can be compressed, and conductive powder in the conductive paste can be sufficiently compacted into a high density, so that a multi-layer wiring substrate with lower resistance and highly reliable electrical connections can be obtained. The effect of the via hole conductors' maintaining their shapes further provides an effect to improve positional accuracy of the via hole conductors.

(Concrete Embodiment 2 for Carrying Out the Invention)

Figure 2:
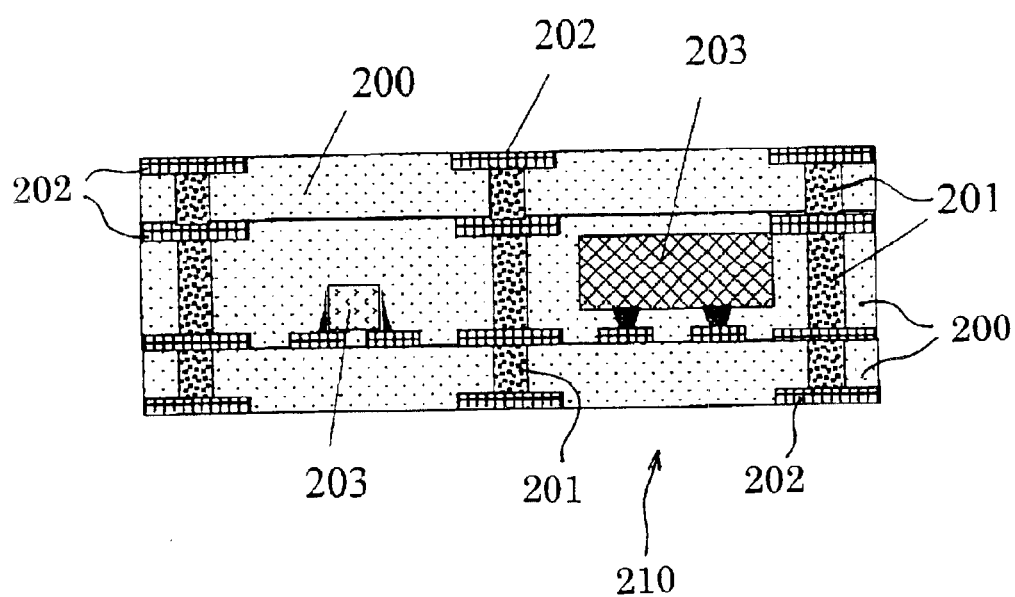
FIG. 2 is a sectional view of a circuit component-embedded multi-layer wiring substrate according to one embodiment of the present invention.

FIG. 2 schematically shows a sectional view of a circuit component-embedded multi-layer wiring substrate (210) (four layers in the shown embodiment) according to one embodiment of the present invention. The wiring substrate (210) comprises insulating layers (200) formed of insulation sheets, via hole conductors (201) formed by filling via holes with conductive paste which starts curing at a temperature lower than a melting-starting temperature of the insulation sheets, and wiring layers (202) which provide metal wirings, with one of the insulating layers (200) having embedded circuit components (203) electrically connected to the wiring layers.

Also, the multi-layer wiring substrate shown in FIG. 2 provides effects which are equivalent to those previously described with reference to FIG. 1. Regarding the insulating layer having the circuit components embedded therein, both of high density mounting of the circuit components by embedding them in the insulating layer, and high density electrical connection by the via hole conductors, can be achieved at the same time, because the via hole conductors formed by filling via holes with the conductive paste can provide lower resistance and highly reliable electrical connections.

(Concrete Embodiment 3 for Carrying Out the Invention)

A concrete embodiment of a process for producing the multi-layer wiring substrate of the present invention is described with reference to schematic sectional views shown in FIGS. 3(a) to 3(i).

An uncured insulation sheet (300) containing an inorganic filler and a thermosetting resin, which forms an insulating layer, is prepared (see FIG. 3(a)), and via holes (301) are formed through the insulation sheet (300) (see FIG. 3(b)). The via holes (301) formed through the insulation sheet (300) are filled with conductive paste, which starts curing at a temperature lower than a melting-starting temperature of the insulation sheet (300), so as to form via hole conductors (302). Thus, an insulation sheet (310) of the present invention is obtained (see FIG. 3(c)). In parallel to the steps shown in FIGS. 3(a) to 3(c), a transferable wiring pattern-including member (315) is prepared (see FIG. 3(d)). The transferable wiring pattern-including member (315) comprises a release carrier (304) which has a wiring layer (303) including metal wirings to be transferred.

Next, as shown in FIG. 3(e), the transferable wiring pattern-including member (315) is aligned relative to and laminated onto one of main surfaces of the insulation sheet (310), and subjected to thermo-compression bonding. After that, the release carrier (304) is removed to thereby complete thermal transfer of the wiring layer (303). As a result, an insulation sheet (320) which has the wiring layer (303) disposed on one of the main surfaces of the insulation sheet (310) and electrically connected to the via hole conductors (302) (shown in the upper portion of FIG. 3(h)) is obtained.

As shown in FIG. 3(f), transferable wiring pattern-including members (315) are aligned relative to and laminated onto both main surfaces of the insulation sheet (310) and subjected to thermo-compression bonding. After that, the release carriers (304) are removed to thereby complete thermal transfer of wiring layers (303). As a result, an insulation sheet (330) which has the wiring layers (303) disposed on both main surfaces of the insulation sheet (310) and electrically connected to the via hole conductors (302) (shown in the middle portion of FIG. 3(h)) is obtained.

Further, as shown in FIG. 3(g), transferable wiring pattern-including member (315) is aligned relative to and laminated onto the other main surface of the insulation sheet (310) and subjected to thermo-compression bonding. After that, release carrier (304) is removed to thereby complete thermal transfer of wiring layer (303). As a result, an insulation sheet (340) which has the wiring layer (303) disposed on another main surface of the insulation sheet 310) and electrically connected to the via hole conductors (302) (shown in the lower portion of FIG. 3(h)) is obtained.

The thermo-compression bonding for preparing these insulation sheets is performed so as to practically cure the conductive paste and, preferably so as to complete curing of the conductive paste. Curing of the insulation sheets must be selectively performed so that these insulation sheets can be mutually bonded to each other by post-thermo-compression bonding which will be performed later. That is, in a case where the insulation sheets are laminated as shown in FIG. 3(h), it is necessary that curing of at least one of adjacent insulation sheets is not completed (including being uncured). Therefore, in a case where one of two adjacent insulation sheets has been completely cured, curing of the other insulation sheet has not been completed. Both, or one of, such insulation sheets may be uncured, or may not be completely cured (for example, in a semi-cured state).

In the embodiment shown in FIG. 3(h), positions of the wiring layers and the via holes are the same in each of the insulation sheets. However, such arrangement is only an example, for purpose of simplification. It is clearly understood that amounts, positions, materials and shapes of the wiring layers and the via holes may differ in accordance with an intended multi-layer wiring substrate to be produced. Also, similarly, a thickness and materials of the insulating layers and insulation sheets may differ.

Next, the insulation sheets (320, 330 and 340) are aligned relative to and laminated onto each other as shown in FIG. 3(h) so that the wiring layers (303) to be electrically connected can contact the via hole conductors (302) when these insulation sheets are subjected to post-thermo-compression bonding. Then, these insulation sheets are bonded together by the post-thermo-compression bonding. As a result, a multi-layer wiring substrate (350) shown in FIG. 3(i) is obtained. During this post-termo-compression bonding, the insulation sheets are bonded to each other, and curing of the insulation sheets is completed, and further, curing of the conductive paste is completed when the conductive paste has not been sufficiently cured during previous thermo-compression bonding. The release carrier (304) of the transferable wiring pattern-including member may be removed when each of the insulation sheets is produced as mentioned above. However, in another embodiment, the release carrier which is finally located at an outermost position (the insulation sheet (320) or (340) in the shown embodiment) may be removed after the post-thermo-compression bonding which integrates the insulation sheets.

By using the conductive paste which starts curing at a temperature lower than the melting-starting temperature of the insulation sheets, curing of the via hole conductors already has proceeded, and preferably has been completed, before the insulation sheets melt and flow during the post-thermo-compression bonding for obtaining the multi-layer wiring substrate shown in FIG. 3(i). Therefore, an effect of the via hole conductors' maintaining their shapes can be obtained, and by this effect, it becomes possible to sufficiently compress the via hole conductors and compact the conductive powder in the conductive paste up to a high density. As a result, the multi-layer wiring substrate can have lower resistance and highly reliable electrical connections between the wiring layers.

Furthermore, the electrical connections between the wiring layers and the via hole conductors can be realized with improved positional accuracy, because dislocation of the via hole conductors hardly occurs. Still furthermore, there is provided an effect of suppressing a failure in connection, such as a short circuit, of adjacent wiring circuits or the like. Such failure is caused by conductive paste in the via hole conductors which flows out and adheres to a surface portion of an insulation sheet between the conductive wiring layers.

Upon thermally-transferring the wiring layers to the insulation sheets during the course of obtaining the insulation sheets as shown in FIGS. 3(e) to 3(g), such effects as mentioned above become more remarkable by selecting conditions under which melting of the insulation sheets, and preferably melting or curing of the insulation sheets can not be practically caused, while the conductive paste alone comprising the via hole conductors is being completely cured.

(Concrete Embodiment 4 for Carrying Out the Invention)

A concrete embodiment, of the present invention for producing a circuit component-embedded multi-layer wiring substrate is described with reference to schematic sectional views shown in FIGS. 4(a) to 4(j).

An uncured insulation sheet (400) containing an inorganic filler and a thermosetting resin, which is to be an insulating layer, is prepared (see FIG. 4(a)), and via holes (401) are formed through the insulation sheet (400) (see FIG. 4(b)). The via holes (401) formed through the insulation sheet are filled with conductive paste which starts curing at a temperature lower than a melting-starting temperature of the insulation sheet (400) so as to form via hole conductors (402). Thus, an insulation sheet (410) of the present invention is obtained (see FIG. 4(c)).

In parallel with the steps shown in FIGS. 4(a) to 4(c), a transferable wiring pattern-including member (415) is prepared (see FIG. 4(d)). The transferable wiring pattern-including member (415) comprises a release carrier (404) which has a wiring layer (403) for providing metal wirings to be transferred. Also, a transferable wiring pattern-including member (416) having circuit components (405) mounted thereon, i.e, electrically connected to wiring layer (403) is prepared (see FIG. 4(e)).

Next, as shown in FIGS. 4(f) and 4(h), insulation sheets (420) and (440), in which the wiring layers (403) are electrically connected to the via hole conductors (402) by thermo-compression bonding, are obtained in the same manners as shown in FIGS. 3(e) and 3(g) (shown in the upper and lower portion of FIG. 4(i)).

As shown in FIG. 4(g), the transferable wiring pattern-including member (415) is aligned relative to and laminated onto one of main surfaces of the insulation sheet (410), and the transferable wiring pattern-including member (416) is aligned relative to and laminated onto the other main surface of the insulation sheet (410), and these transferable wiring pattern-including members and the insulation sheet are subjected to thermo-compression bonding. During this operation, the thermo-compression bonding is performed so that the circuit components (405) can be embedded in the insulation sheet (410): the thermo-compression bonding is performed under such a condition that causes the insulation sheet (410) to melt. After that, the release carriers (404) are removed. As a result, there is obtained an insulation sheet (430) which has the wiring layers (403) disposed on both main surfaces of the insulation sheet (410) and electrically connected to the via hole conductors (402), and which has the circuit components (405) having been electrically connected to one the the wiring layers in advance and then embedded in the insulation sheet (shown in the middle portion of FIG. 4(i)).

Next, the insulation sheets (420, 430 and 440) are subjected to post-thermo-compression bonding in the same manner as shown in FIG. 3(h) to obtain a circuit component-including multi-layer wiring substrate (450) as shown in FIG. 4(j).

By using conductive paste which starts curing at a temperature lower than the melting-starting temperature of the insulation sheet (400), curing of the conductive paste in the via holes (401) already has proceeded, and preferably has been practically completed before the insulation sheet (400) flows in association with embedding of the circuit components (405) into the insulation sheet (400) during the thermo-compression bonding in the step shown in FIG. 4(g). As a result, shapes of the via holes, i.e., the via hole conductors can be maintained substantially the same as originally formed through the insulation sheet. By this effect of the via hole conductors' maintaining their shapes, it becomes possible to sufficiently compress the via hole conductors and compact the conductive powder in the conductive paste up to a high density. As a result, the multi-layer wiring substrate can have lower resistance and highly reliable interlayer electrical connections. Furthermore, electrical connections between the wiring layers and the via hole conductors can be realized with improved positional accuracy because dislocation of the via hole conductors hardly occurs.

(Concrete Embodiment 5 for Carrying Out the Invention)

Another concrete embodiment of the process of the present invention for producing the circuit component-including multi-layer wiring substrate is described with reference to the schematic sectional views shown in FIGS. 5(a) to 5(h).

Figure 5:
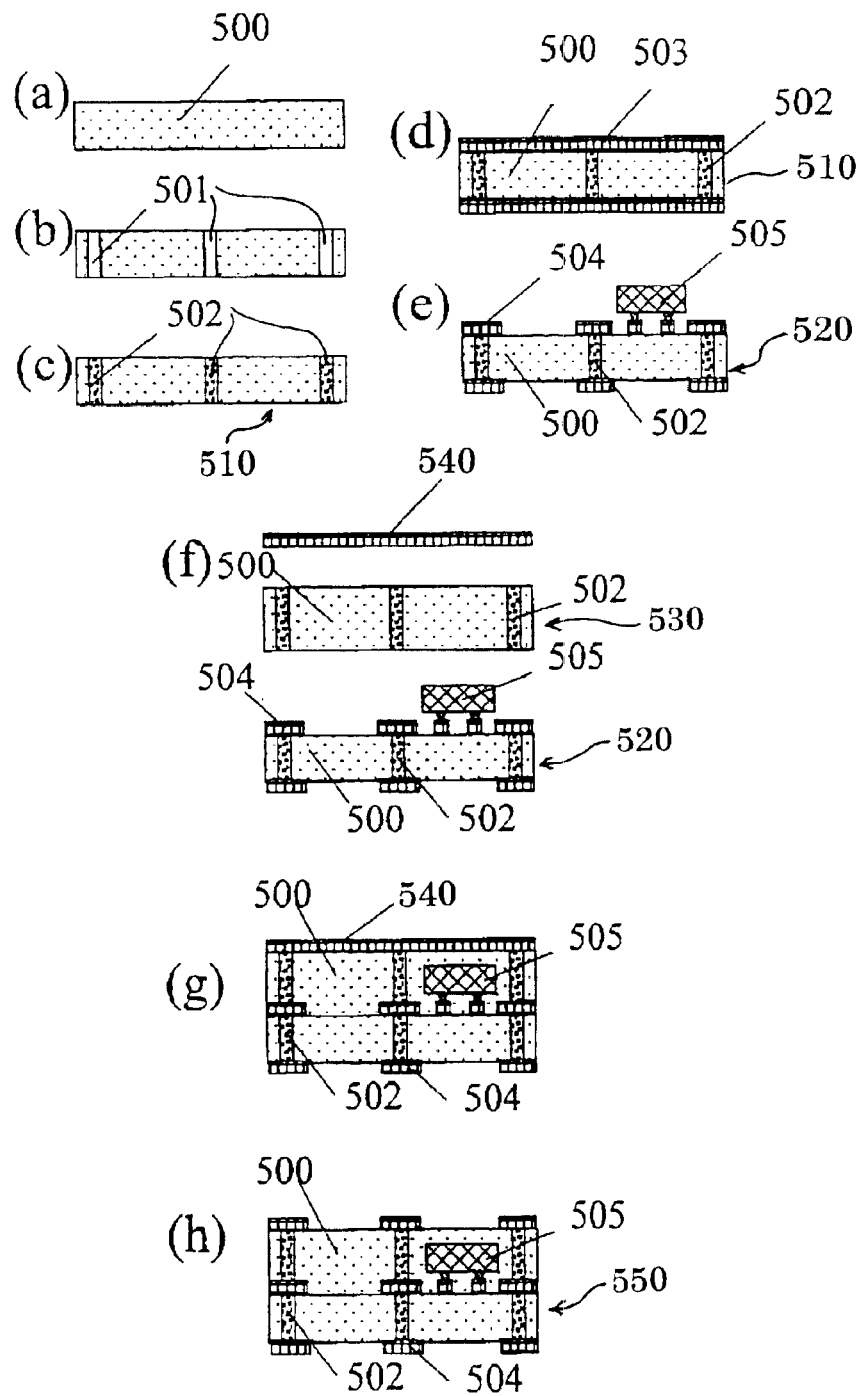
FIGS. 5(a)–5(h) show sectional views illustrating steps for producing a circuit component-embedded multi-layer wiring substrate according to another embodiment of the present invention.

An uncured insulation sheet (500) containing an inorganic filler and a thermosetting resin, which is to be an insulating layer, is prepared (see FIG. 5(a)), and via holes (501) are formed through the insulation sheet (500) (see FIG. 5(b)). The via holes (501) formed through the insulation sheet (500) are filled with conductive paste which starts curing at a temperature lower than a melting-starting temperature of the insulation sheet so as to form via hole conductors (502). Thus, an insulation sheet (510) of the present invention is obtained (see FIG. 5(c)).

Next, as shown in FIG. 5(d), metal foils (503) are applied onto both main surfaces of the insulation sheet (510). Then, the metal foils (503) are, for example, chemically etched by a subtractive process as shown in FIG. 5(e) to form wiring layer (504) composed of predetermined metal wirings. In this case, it is preferable that curing of the conductive paste is allowed to proceed, and more preferably substantially be completed by thermo-compression bonding. Subsequently, a circuit component (505) is mounted on the metal wiring layer (504) thus formed, so that an insulation sheet (520) having the circuit component on its outer surface is obtained.

Next, as shown in FIG. 5(f), the insulation sheet (520), an insulation sheet (530) which has via hole conductors (502) and which is to form a layer in which the circuit component (505) is embedded, and a metal foil (540) are prepared. These members are aligned relative to and laminated onto each other so that the insulation sheet (530) is located between the insulation sheet (520) and the metal foil (540), and so that the metal foil (540) is adjacent to the main surface of the insulation sheet (530) which is not opposite to the metal wiring layer (504) or the circuit component (505) of the insulation sheet (520).

After that, as shown in FIG. 5(g), these members are together subjected to post-thermo-compression bonding. By this post-thermo-compression bonding, the circuit component (505) is embedded into the insulation sheet (530) (which may be replaced by the insulation sheet (510)), the metal foil (540) is adhered to the insulation sheet (530), the insulation sheets (520, 530) are bonded to each other, and thermosetting resins in the insulation sheets are completely cured. If curing of the conductive paste is insufficient before the post-thermo-compression bonding, or if the conductive paste (like, the conductive paste contained in the insulation sheet (530)) is uncured before the post-thermo-compression bonding, the conductive paste is also completely cured by this post-thermo-compression bonding.

Finally, as shown in FIG. 5(h), the metal foil (540) applied to the insulation sheet (530) is, for example, chemically etched by a subtractive process to form predetermined metal wirings. Thus, a circuit component-including multi-layer wiring substrate (550) is obtained.

By using conductive paste which starts curing at a temperature lower than the melting-starting temperature of the insulation sheets, shapes of the via hole conductors formed by filling via holes with the conductive paste can be maintained against flowing of the insulation sheet in association with embedding of the circuit component, and thus, effects equivalent to those obtained by the previous embodiment 4 can be obtained.

EXAMPLES

Example 1

Figure 3:
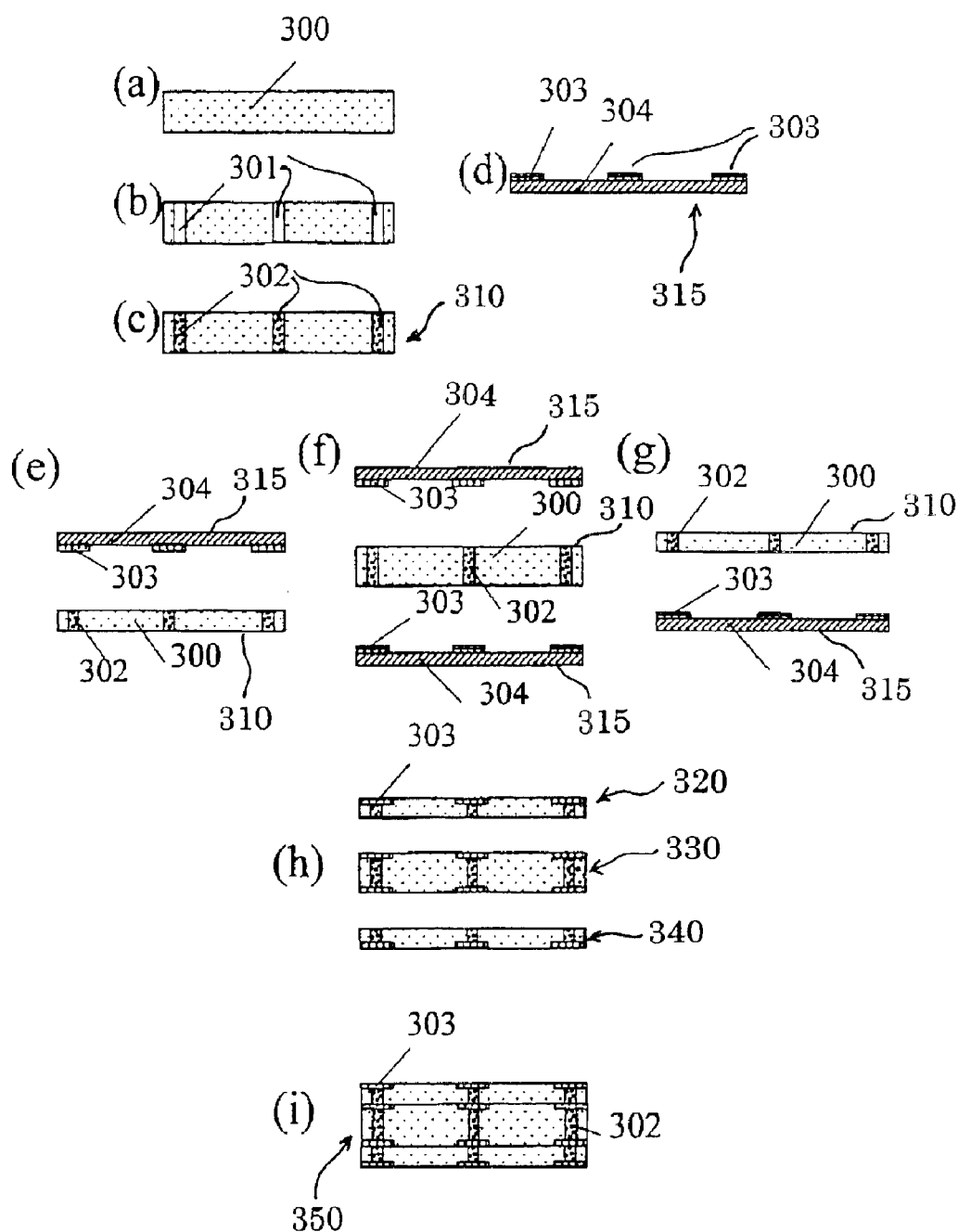
FIGS. 3(a)–3(i) show sectional views illustrating steps for producing a multi-layer wiring substrate according to one embodiment of the present invention.

A four-layer wiring substrate, as shown in FIG. 1, comprising via hole conductors formed by filling via holes with conductive paste was produced according to a process similar to the process previously described with reference to FIG. 3. For ease of understanding, reference numerals which are the same as those denoting the elements shown in FIG. 3 are also used herein.

First, a transferable wiring pattern-including member (315) for use in forming a wiring layer (303) having predetermined wirings was prepared as follows. An electrolytic copper foil with a thickness of 70 $\mu$m was prepared as a first metal layer which functions as a substrate of a release carrier. An Ni plating layer with a thickness of 100 to 200 nm as a release layer was formed on the first metal layer to provide a release carrier (304). Then, a second metal layer of copper with a thickness of 9 $\mu$m was formed on the Ni plating layer by performing an electrolytic plating process to obtain a three-layer structure comprising the first metal layer, the release layer and the second metal layer, which was to form metal wirings.

Next, a wiring layer was formed by performing a photolithographic process: a dry film resist was applied on the second metal layer, and a portion of the resist corresponding to a wiring pattern portion of the second metal layer was exposed and developed, followed by performing a subtractive process such as chemical etching to form the wiring layer (303); and finally, the exposed portion of the dry film resist used as a mask was removed. Thus, an intended transferable wiring pattern-including member (315) was obtained (see FIG. 3(d)).

Next, an insulation sheet (300), with a thickness of 200 $\mu$m, containing an uncured thermosetting resin was prepared (see FIG. 3(a)). Then, a predetermined number of via holes (301) with a diameter of 200 $\mu$m were formed through the insulation sheet (see FIG. 3(b)), and the via holes (301) were filled with conductive paste to form via hole conductors (302). Thus, an insulation sheet (310) having the via hole conductors (302) formed therein was prepared (see FIG. 3(c)).

Two transferable wiring pattern-including members (315) were aligned relative to and laminated onto both main surfaces of the insulation sheet (310) (see FIG. 3(f)), and heated and pressed at 200° C. under a pressure of 75 kg/cm$^2$ for 1.5 hours. By doing so, the transferable wiring pattern-including members (315) and the insulation sheet (310) were thermally compressed and bonded to each other, so that wiring layers (303) were disposed on the insulation sheet and electrically connected to the via hole conductors (302). After that, the release carriers (304) of the transferable wiring pattern-including members were removed to obtain an intended insulation sheet (330) having the wiring layers on both main surfaces thereof.

Next, insulation sheets (310) having via hole conductors formed therein were aligned relative to and laminated on both main surfaces of the insulation sheet (330), and further, transferable wiring pattern-including members (315) were aligned relative to and laminated onto main surfaces of the insulation sheets (310) which did not confront the insulation sheet (330). In this regard, the process shown in FIG. 3 differs from the present example in that insulation sheets (320) and (340) having wiring layers thereon in advance were used instead of the insulation sheets (310) and the transferable wiring pattern-including members (315).

These insulation sheets (310, 310) and (330) and the two wiring pattern-including members (315, 315) were heated and pressed at 200° C. under a pressure of 75 kg/cm$^2$ for 1.5 hours for post-thermal-compression bonding so as to bond these members together. By this post-thermo-compression bonding, the wiring layers (303) and the insulation sheets (310) were bonded to each other, the insulation sheets (310 and 330) were bonded to each other, and thermosetting resins in the insulation sheets and the conductive paste were cured. After that, the release carriers (304) of the transferable wiring pattern-including members (315) were peeled off to obtain an intended four-layer wiring substrate shown in FIG. 1.

In this example, three types of conductive paste having the following compositions and curing-starting temperatures of 90° C., 100° C. and 120° C., respectively, were prepared, and by using these respective types of conductive paste, substrate (1) (the curing-starting temperature of 90° C.), substrate (2) (the curing-starting temperature of 100° C.) and substrate (3) (the curing-starting temperature of 120° C.), were obtained. Hereinafter, compositions of material used for making the insulation sheets and the process of making these sheets will be described.

(Composition of Material Used for Production of Insulation sheet)

| | |
|---|---|
| Al$_2$O$_3$ (AS-40 with a particle size of 12 $\mu$m, manufactured by Showa Denko K.K.): | 90 wt. % |
| Liquid thermosetting epoxy resin (EF-450, manufactured by Japan Rec Co., Ltd.) | 9.5 wt. % |
| Carbon black (manufactured by Toyo Carbon Co., Inc.) | 0.2 wt. % |
| Coupling agent (titanate type, 46B, manufactured by Ajinomoto Co., Inc.) | 0.3 wt. % |

These respective components as above were weighed according to the above composition to obtain a mixture, and methyl ethyl ketone as a viscosity-adjusting solvent was added to the mixture so that a slurry viscosity of the mixture was adjusted to about 20 Pa.s. Next, alumina balls were added to the mixture, and they were rotated at 500 rpm in a pot for 48 hours to prepare a slurry as a raw material for the insulation sheet. Then, the slurry was applied in a film form with a doctor blade and dried. Thus, the insulation sheet was obtained.

Next, a melting-starting temperature of the insulation sheet was measured. Upon this measurement, a temperature vs. viscosity characteristic of the insulation sheet was measured using an apparatus described before. The melting-starting temperature of the insulation sheet was determined as follows: the insulation sheet was heated from room temperature, and a temperature at which viscosity of the insulation sheet at 50° C. decreased to one-fiftieth (1/50) was defined as the melting-starting temperature of the sheet. The melting-starting temperature of the insulation sheet prepared above was 100° C. In this regard, the temperature at which the viscosity of the insulation sheet at room temperature decreased to one-hundredth (1/100) was substantially the same as the temperature at which the viscosity of the insulation sheet at 50° C. decreased to one-fiftieth.

(Conductive Paste)

| | |
|---|---|
| Spherical copper particles (with a particle size of 5 $\mu$m, manufactured by Mitsui Milling and Smelting Co., Ltd.) | 85 wt. % |
| Bisphenol F type thermosetting epoxy resin (Epicoat 807, manufactured by Yuka Shell Epoxy K.K.) | 7 wt. % |
| Novolak type phenol resin (BRG558, manufactured by Showa Highpolymer Co., Ltd.) | 3 wt. % |
| Butyl carbitol (Japan Alcohol Trading Co., Ltd.) | 5 wt. % |

To 100 parts by weight of the total of these above components was added 1 part by weight, 0.7 parts by weight or 0.5 parts by weight of 2-ethyl-4-methylimidazole as a curing accelerator, and this mixture was kneaded-with a three-roll mill to form paste.

Using the above described process and the apparatus, curing-starting temperatures of three kinds of conductive paste were measured by thermal analysis by virtue of DTA (differential thermal analysis). As a result, the curing-starting temperature of the conductive paste (1 part by weight of 2-ethyl-4-methylimidazole added) was 90° C.; the curing-starting temperature of the conductive paste (0.7 parts by weight of 2-ethyl-4-methylimidazole added) was 100° C.; and the curing-starting temperature of the conductive paste (0.5 parts by weight of 2-ethyl-4-methylimidazole added) was 120° C.

The wiring substrates as produced above were evaluated as follows:
A total resistance value of 300 via holes, electrically connected in series, of each of the above produced wiring substrates was measured immediately after production of the wiring substrate (an initial electrical resistance value), after the same wiring substrate was left to stand in an atmosphere of 85° C. and a relative humidity of 85% for one week, after which the same wiring substrate firstly passed through a reflow furnace at a highest temperature of 230° C., after the same wiring substrate passed through the reflow furnace 5 times, and after the same wiring substrate passed through the reflow furnace 10 times, respectively. Results of measurement of resistance values are shown in Table 1.

TABLE 1

| | | Resistance ($\Omega$) in Reliability Test | | | |
|---|---|---|---|---|---|
| | Resistance after production ($\Omega$) | After absorbing moisture | Passing through reflow furnace (one time) | Passing through reflow furnace (5 times) | Passing through reflow furnace (10 times) |
| Wiring substrate 1 (the present invention) | 7.52 | 7.75 | 8.08 | 8.07 | 8.06 |
| Wiring substrate 2 (Com. Ex.) | 18.02 | 23.50 | 125.30 | 121.90 | 118.70 |
| Wiring substrate 3 (Com. Ex.) | 32.10 | 50.20 | 250.50 | 247.40 | 243.30 |

As understood from Table 1, the wiring substrate 1, which was produced using the conductive paste which started curing at 90° C., lower than the melting-starting temperature of 100° C. of the insulation sheet, showed lowest resistance in any of the tests, as compared with wiring substrates 2 and 3. This means that an electrical connection in the wiring substrate 1 of the present invention is superior in terms of electrical resistance and reliability.

Example 2

Figure 4:
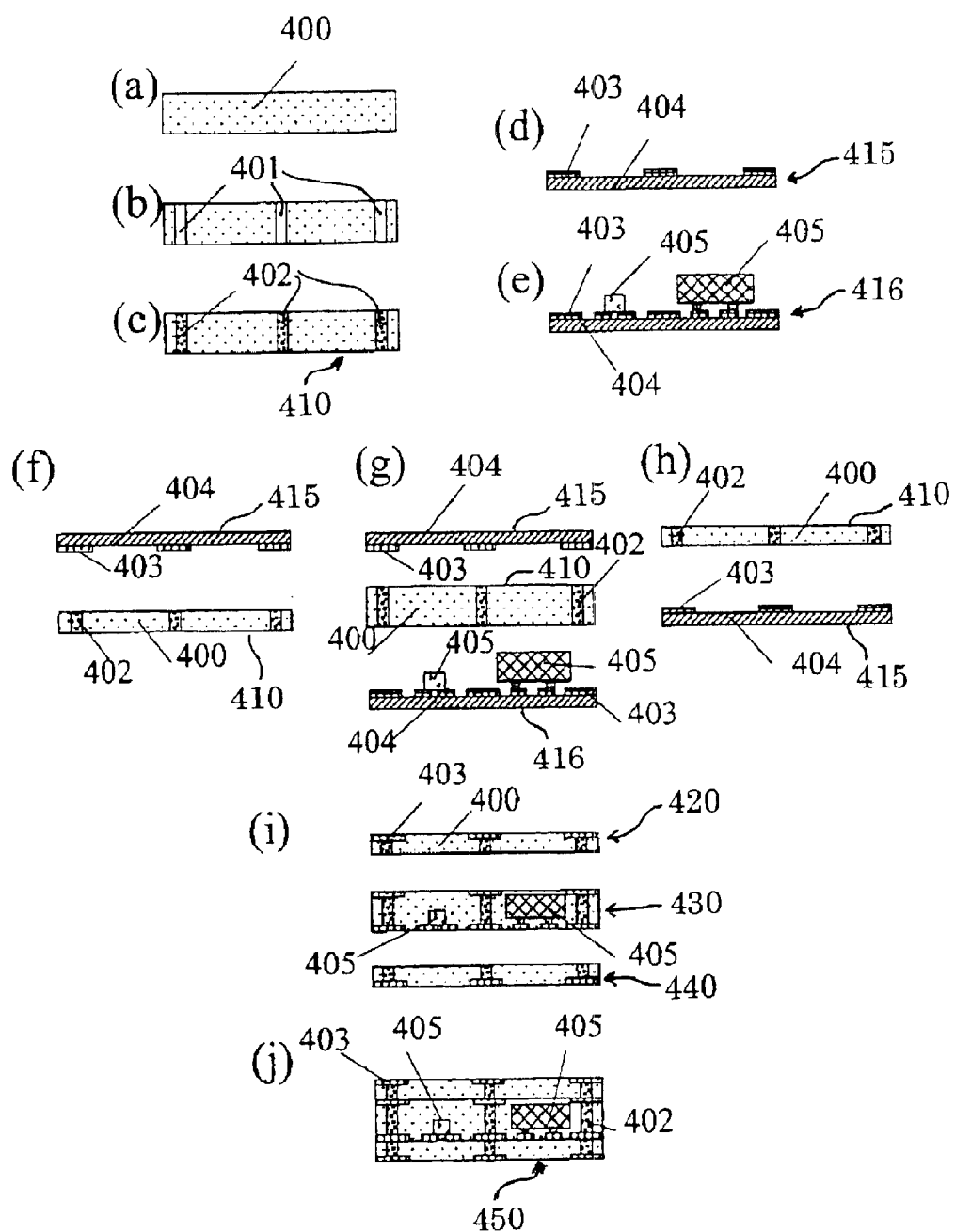
FIGS. 4(a)–4(j) show sectional views illustrating steps for producing a circuit component-embedded multi-layer wiring substrate according to one embodiment of the present invention.

A circuit component-including wiring substrate of the present invention, which had a circuit component embedded in its insulating layer, was produced. Since the process of producing the wiring substrate is partially similar to the process described with reference to FIG. 4, reference numerals which are the same as those denoting the elements shown in FIG. 4 are herein used for ease of understanding.

A transferable wiring pattern-including member (415) was prepared in the same manner as in Example 1. Further, a semiconductor device with a thickness of 300 µm (10 mm (lengthwise)×10 mm (widthwise)) was bonded on the metal wiring formed on the transferable wiring pattern-including member by performing flip chip bonding using an electrically conductive adhesive. Thus, a transferable wiring pattern-including member (416) having the semiconductor device (405) as a circuit component was prepared.

Using the same materials as in Example 1, an insulation sheet (400) with a thickness 600 µm was prepared, and a predetermined number of via holes (401) with a diameter of 400 µm were formed through the insulation sheet and filled with the same conductive paste as in Example 1, to form via hole conductors (402). Thus, an insulation sheet (410) having the via hole conductors (402) formed therein was prepared. In this regard, the via holes were formed 500 µm away from a periphery of a region where the semiconductor device was to be embedded, that is, an outer peripheral portion of the semiconductor device (i.e., four sides of the device).

Next, the insulation sheet (410), the transferable wiring pattern-including member (415) having the wiring layer (403) formed thereon, and the transferable wiring pattern-including member (416) having the semiconductor device (405) mounted thereon were aligned relative to and laminated onto each other, and subjected to heating and pressing at 175° C. under a pressure of 10 kg/cm² for 1.5 hours. Thus, the semiconductor device (405) on the transferable wiring pattern-including member was embedded in the insulation sheet (410), and the insulation sheet and the conductive paste were cured.

After that, transfer carriers (404) of the transferable wiring pattern-including member were peeled off to transfer the wiring layers onto the insulation sheet. Thus, a both-sided wiring substrate having the semiconductor device (405) embedded in the insulating layer (corresponding to the insulation sheet (430) which has been completely cured) was obtained. Using the same conductive paste as in Example 1 (the three types of the conductive paste having curing-starting temperatures 90° C., 100° C. and 120° C., respectively), circuit component-embedded wiring substrate 4 (the curing-starting temperature of 90° C.), circuit component-embedded wiring substrate 5 (the curing-starting temperature of 100° C.), and circuit component-embedded wiring substrate 6 (the curing-starting temperature of 120° C.) were produced. The resultant wiring substrates were evaluated in the same manner as in Example 1. The results are shown in Table 2.

TABLE 2

| | | Resistance ($\Omega$) in Reliability Test | | | |
|---|---|---|---|---|---|
| | Resistance after production ($\Omega$) | After absorbing moisture | Passing through reflow furnace (one time) | Passing through reflow furnace (5 times) | Passing through reflow furnace (10 times) |
| Circuit component-embedded wiring substrate 4 (the present invention) | 2.02 | 2.25 | 2.58 | 2.57 | 2.52 |

TABLE 2-continued

| | Resistance (Ω) in Reliability Test | | | | |
|---|---|---|---|---|---|
| | Resistance after production (Ω) | After absorbing moisture | Passing through reflow furnace (one time) | Passing through reflow furnace (5 times) | Passing through reflow furnace (10 times) |
| Circuit component-embedded wiring substrate 5 (Com. Ex.) | 8.01 | 13.10 | 98.90 | 95.20 | 92.30 |
| Circuit component-embedded wiring substrate 6 (Com. Ex.) | X | X | X | X | X |

Note:
the mark X means that no electrical connection was formed.

As seen from Table 2, wiring substrate 4 produced using the conductive paste which started curing at 90° C., lower than the melting-starting temperature of 100° C. of the insulation sheet, showed lowest resistance in any of the tests, as compared with wiring substrates 5 and 6. Thus, it is found that electrical connection in wiring substrate 4 of the present invention was superior in terms of electrical resistance and reliability. The mark "X" seen in the table means that electrical connection was impossible because of dislocation of via holes.

EFFECT OF THE INVENTION

According to the present invention, in production of a multi-layer wiring substrate and circuit component-embedded wiring substrate, interlayer electrical connection is performed by via hole conductors formed by filling via holes in an insulation sheet with conductive paste which starts curing at a temperature lower than a melting-starting temperature of the insulation sheet. By doing so, the via hole conductors can maintain their shapes against flowing of a melted insulation sheet and flowing of the insulation sheet in association with embedding of the circuit component into the insulation sheet. Thus, the via hole conductors can be sufficiently compressed, and conductive powder in the conductive paste can be compacted up to a high density. Therefore, a multi-layer wiring substrate and a circuit component-including multi-layer wiring substrate can have lower resistance and higher reliability.

What is claimed is:

1. A multi-layer wiring substrate comprising:
   at least one insulating layer;
   wiring layers disposed on both sides of said at least one insulating layer; and
   via hole conductors located in via holes penetrating said at least one insulating layer so as to be electrically connected to said wiring layers,
   wherein said via hole conductors are formed of a conductive paste having a curing-starting temperature lower than a melting-starting temperature of an insulation sheet which is to form said at least one insulating layer.

2. The multi-layer wiring substrate according to claim 1, wherein said curing-starting temperature of said conductive paste is 50 to 150° C.

3. The multi-layer wiring substrate according to claim 1, wherein said conductive paste comprises conductive powder and an organic binder, and a weight ratio of said conductive powder to said organic binder is 85 to 95:5 to 15.

4. The multi-layer wiring substrate according to claim 3, wherein said conductive powder is at least one of
   (i) a metal powder selected from the group consisting of gold powder, silver powder, palladium powder, copper powder, nickel powder, tin powder and lead powder,
   (ii) powder of an alloy of any combination of gold, silver, palladium, copper, nickel, tin and lead, and
   (iii) powder having
      (a) a core of a metal selected from one of
         (1) the group consisting of gold, silver, palladium, copper, nickel, tin and lead, and
         (2) an alloy of any combination of gold, silver, palladium, copper, nickel, tin and lead, and
      (b) a coating of a metal selected from one of
         (1) the group consisting of gold, silver, palladium, copper, nickel, tin and lead, and
         (2) an alloy of any combination of gold, silver, palladium, copper, nickel, tin and lead,
   with the proviso that the metal of said core is different than the metal of said coating.

5. The multi-layer wiring substrate according to claim 3, wherein said organic binder includes a thermosetting resin which is at least one selected from the group consisting of epoxy resins, phenol resins, cyanate resins, and polyphenylene ether resins.

6. The multi-layer wiring substrate according to claim 3, wherein said organic binder includes a curing catalyst or a curing accelerator which comprises at least one compound selected from the group consisting of amine compounds, imdazoles, imidazole derivatives, and onium salts.

7. The multi-layer wiring substrate according to claim 1, wherein said insulation sheet includes a thermosetting resin which is at least one selected from the group consisting of epoxy resins, phenol resins and cyanate resins.

8. The multi-layer wiring substrate according to claim 1, wherein said insulation sheet includes an inorganic filler in an amount of 50 to 70 vol. % based on a volume of said insulation sheet.

9. The multi-layer wiring substrate according to claim 8, wherein said inorganic filler comprises at least one selected from the group consisting of $Al_2O_3$, $SiO_2$, MgO, BN and AlN.

10. The multi-layer wiring substrate according to claim 1, wherein said curing-starting temperature of said conductive paste is lower than said melting-starting temperature of said insulation sheet by at least 5° C.

11. The multi-layer wiring substrate according to claim 1, further comprising:
   a circuit component electrically connected to at least one of said wiring layers and embedded in said at least one insulating layer.

12. An insulation sheet for use in production of a wiring substrate, said insulation sheet comprising:
   insulating material; and
   conductive paste filled into via holes formed through said insulating material so as to define via hole conductors,
   wherein said conductive paste has a curing-starting temperature lower than a melting-starting temperature of said insulating material.

13. The insulation sheet according to claim 12, wherein said curing-starting temperature of said conductive paste is 50 to 150° C.

14. The insulation sheet according to claim 12, wherein said conductive paste includes conductive powder and an organic binder, and a weight ratio of said conductive powder to said organic binder is 85 to 95:5 to 15.

15. The insulation sheet according to claim 14, wherein said conductive powder is at least one of
    (i) a metal powder selected from the group consisting of gold powder, silver powder, palladium powder, copper powder, nickel powder, tin powder and lead powder,
    (ii) powder of an alloy of any combination of gold, silver, palladium, copper, nickel, tin and lead, and
    (iii) powder having
        (a) a core of a metal selected from one of
            (1) the group consisting of gold, silver, palladium, copper, nickel, tin and lead, and
            (2) an alloy of any combination of gold, silver, palladium, copper, nickel, tin and lead, and
        (b) a coating of a metal selected from one of
            (1) the group consisting of gold, silver, palladium, copper, nickel, tin and lead, and
            (2) an alloy of any combination of gold, silver, palladium, copper, nickel, tin and lead,
    with the proviso that the metal of said core is different than the metal of said coating.

16. The insulation sheet according to claim 14, wherein said organic binder includes a thermosetting resin which is at least one selected from the group consisting of epoxy resins, phenol resins, cyanate resins, and polyphenylene ether resins.

17. The insulation sheet according to claim 14, wherein said organic binder includes a curing catalyst or a curing accelerator which comprises at least one compound selected from the group consisting of amine compounds, imdazoles, imidazole derivatives, and onium salts.

18. The insulation sheet according to claim 12, wherein said insulating material includes a thermosetting resin which is at least one selected from the group consisting of epoxy resins, phenol resins and cyanate resins.

19. The insulation sheet according to claim 12, wherein said insulating material includes an inorganic filler in an amount of 50 to 70 vol. % based on a volume of said insulating material.

20. The insulation sheet according to claim 19, wherein said inorganic filler comprises at least one selected from the group consisting of $Al_2O_3$, $SiO_2$, MgO, BN and AlN.

21. The insulation sheet according to claim 12, wherein said curing-starting temperature of said conductive paste is lower than said melting-starting temperature of said insulating material by at least 5° C.

22. A process for preparing an insulation sheet, comprising:
    forming via holes through an insulation sheet, and
    filling said via holes with conductive paste which has a curing-starting temperature lower than a melting-starting temperature of said insulation sheet.

23. The process according to claim 17, wherein said curing-starting temperature of said conductive paste is 50 to 150° C.

24. The process according to claim 17, wherein said conductive paste includes conductive powder and an organic binder, and a weight ratio of said conductive powder to said organic binder is 85 to 95:5 to 15.

25. The process according to claim 24, wherein said conductive powder is at least one of
    (i) a metal powder selected from the group consisting of gold powder, silver powder, palladium powder, copper powder, nickel powder, tin powder and lead powder,
    (ii) powder of an alloy of any combination of gold, silver, palladium, copper, nickel, tin and lead, and
    (iii) powder having
        (a) a core of a metal selected from one of
            (1) the group consisting of gold, silver, palladium, copper, nickel, tin and lead, and
            (2) an alloy of any combination of gold, silver, palladium, copper, nickel, tin and lead, and
        (b) a coating of a metal selected from one of
            (1) the group consisting of gold, silver, palladium, copper, nickel, tin and lead, and
            (2) an alloy of any combination of gold, silver, palladium, copper, nickel, tin and lead,
    with the proviso that the metal of said core is different than the metal of said coating.

26. The process according to claim 24, wherein said organic binder includes a thermosetting resin which is at least one selected from the group consisting of epoxy resins, phenol resins, cyanate resins, and polyphenylene ether resins.

27. The process according to claim 24, wherein said organic binder includes a curing catalyst or a curing accelerator which comprises at least one compound selected from the group consisting of amine compounds, imdazoles, imidazole derivatives, and onium salts.

28. The process according to claim 22, wherein the said insulation sheet includes a thermosetting resin which is at least one selected from the group consisting of epoxy resins, phenol resins and cyanate resins.

29. The process according to claim 22, wherein said insulation sheet includes an inorganic filler in an amount of 50 to 70 vol. % based on volume of said insulation sheet.

30. The process according to claim 29, wherein said inorganic filler comprises at least one selected from the group consisting of $Al_2O_3$, $SiO_2$, MgO, BN and AlN.

31. The process according to claim 22, wherein said curing-starting temperature of said conductive paste is lower than said melting-starting temperature of said insulation sheet by at least 5° C.

32. A process for producing a wiring substrate, comprising:
    preparing an insulation sheet including
        (i) insulating material, and
        (ii) conductive paste filled into via holes formed through said insulating material so as to define via hole conductors,
        wherein said conductive paste has a curing-starting temperature lower than a melting-starting temperature of said insulating material, and
    disposing a wiring layer onto at least one of main surfaces of said insulation sheet to thereby electrically connect said via hole conductors to said wiring layer.

33. The process according to claim 32, wherein said curing-starting temperature of said conductive paste is lower than said melting-starting temperature of said insulating material by at least 5° C.

34. The process according to claim 32, wherein
    disposing a wiring layer onto at least one of main surfaces of said insulation sheet, to thereby electrically connect said via hole conductors to said wiring layer, includes performing a thermo-compression bonding operation.

35. The process according to claim 34, wherein
performing said thermo-compression bonding operation results in thermal transfer of said wiring layer to said insulation sheet.

36. The process according to claim 35, further comprising:
electrically connecting a circuit component to said wiring layer prior to performing said thermo-compression bonding operation,
wherein performing said thermo-compression bonding operation results in said circuit component becoming embedded within said insulation sheet.

37. The process according to claim 34, wherein
performing said thermo-compression bonding operation comprises heating and bonding, under pressure if necessary, a metal foil to said insulation sheet, and
disposing a wiring layer onto at least one of main surfaces of said insulation sheet includes etching said metal foil to form said wiring layer.

38. The process according to claim 34, wherein
performing said thermo-compression bonding operation comprises performing said thermo-compression bonding operation during plural steps,
with said conductive paste being substantially cured, without said insulation sheet being substantially melted, during a first of said plural steps, and
with said insulation sheet being cured during a subsequent one of said plural steps.

39. The process according to claim 34, further comprising:
disposing another wiring layer on another of said main surfaces of said insulation sheet to thereby electrically connect said via hole conductors to said another wiring layer; and
curing said insulating material by performing a post-thermo-compression bonding operation after performing said thermo-compression bonding operation.

40. The process according to claim 34, further comprising:
providing another insulation sheet;
laminating said another insulation sheet onto said insulation sheet, after performing said thermo-compression bonding operation, by one of
(i) aligning said insulation sheet and said another insulation sheet such that predetermined regions of said wiring layer can be electrically connected to via hole conductors of said another insulation sheet upon performance of a post-thermo-compression bonding operation on said insulation sheet and said another insulation sheet, and
(ii) aligning said insulation sheet and another insulation sheet such that said via hole conductors of said insulation sheet can be electrically connected to a wiring layer of said another insulation sheet upon performance of a post-thermo-compression bonding operation on said insulation sheet and said another insulation sheet;
aligning any other insulation sheet with said insulation sheet and said another insulation sheet such that said any other insulation sheet can be electrically connected to said insulation sheet and said another insulation sheet upon performance of a post-thermo-compression bonding operation on said insulation sheet, said another insulation sheet and said any other insulation sheet; and
performing a post-thermo-compression bonding operation on at least said insulation sheet and said another insulation sheet.

41. The process according to claim 40, wherein
performing said thermo-compression bonding results in incomplete curing or no curing of said insulation sheets, and
performing said post-thermo-compression bonding results in complete curing of said insulation sheets.

42. The process according to claim 40, wherein
performing said post-thermo-compression bonding operation comprises performing said post-thermo-compression bonding operation during plural steps, such that if curing of said conductive paste is not completed by performing said thermo-compression bonding operation
(i) said conductive paste becomes substantially cured, without substantially melting said insulation sheets, during a first of said plural steps, and
(ii) said insulation sheets become completely cured during a subsequent one of said plural steps.

43. The process according to claim 40, further comprising:
electrically connecting a circuit component to said wiring layer prior to performing said thermo-compression bonding operation,
wherein performing said thermo-compression bonding operation results in said circuit component becoming embedded within said insulation sheet.

44. The process according to claim 40, wherein
performing said thermo-compression bonding operation results in a circuit component being electrically connected to said wiring layer and located outside of said insulation sheet.

* * * * *

UNITED STATES PATENT AND TRADEMARK OFFICE
CERTIFICATE OF CORRECTION

PATENT NO. : 6,855,892 B2
DATED : February 15, 2005
INVENTOR(S) : Shingo Komatsu et al.

It is certified that error appears in the above-identified patent and that said Letters Patent is hereby corrected as shown below:

<u>Title page,</u>
Item [57], ABSTRACT,
Line 2, change "bole" to -- hole --.

<u>Column 30,</u>
Line 49, change "AIN" to -- AlN --.

<u>Column 31,</u>
Line 48, change "AIN" to -- AlN --.
Lines 59 and 62, change "17" to -- 22 --.

<u>Column 32,</u>
Line 40, change "AIN" to -- AlN --.

Signed and Sealed this

Sixth Day of September, 2005

JON W. DUDAS
*Director of the United States Patent and Trademark Office*